US007991606B1

(12) United States Patent
D'Souza et al.

(10) Patent No.: US 7,991,606 B1
(45) Date of Patent: Aug. 2, 2011

(54) EMBEDDED LOGIC ANALYZER FUNCTIONALITY FOR SYSTEM LEVEL ENVIRONMENTS

(75) Inventors: Maria D'Souza, San Jose, CA (US); Philippe Molson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1686 days.

(21) Appl. No.: 10/405,836

(22) Filed: Apr. 1, 2003

(51) Int. Cl.
*G06F 9/455* (2006.01)

(52) U.S. Cl. ........................................................ 703/28

(58) Field of Classification Search .................... 703/12, 703/23, 28, 13; 716/1, 16, 18; 714/39
See application file for complete search history.

(56) References Cited

U.S. PATENT DOCUMENTS 4,495,599 A * 1/1985 Haag et al. .................... 345/440
5,204,829 A 4/1993 Lyu et al.
5,282,213 A * 1/1994 Leigh et al. .................. 714/724
5,452,239 A 9/1995 Dai et al. ......................... 703/19
5,544,067 A 8/1996 Rostoker et al. ................ 703/14
5,726,902 A 3/1998 Mahmood et al.
5,848,262 A 12/1998 Burch
6,026,226 A * 2/2000 Heile et al. ..................... 716/12
6,053,947 A 4/2000 Parson
6,067,650 A 5/2000 Beausang et al. ............. 714/726
6,086,624 A 7/2000 Murata
6,110,223 A * 8/2000 Southgate et al. .............. 716/18
6,152,612 A 11/2000 Liao et al. ....................... 703/23
6,182,247 B1 1/2001 Herrmann et al. .............. 714/39
6,247,147 B1 6/2001 Beenstra et al. ................ 714/39
6,247,165 B1 6/2001 Wohl et al. ......................... 716/5
6,286,114 B1 9/2001 Veenstra et al. ................ 714/39
6,317,860 B1 * 11/2001 Heile ................................ 716/5
6,389,558 B1 * 5/2002 Herrmann et al. .............. 714/39
6,425,116 B1 7/2002 Duboc et al.
6,460,148 B2 * 10/2002 Veenstra et al. ................ 714/39
6,530,073 B2 3/2003 Morgan .......................... 716/18
6,539,536 B1 3/2003 Singh et al. ...................... 716/18
6,588,004 B1 * 7/2003 Southgate et al. .............. 716/11
6,588,006 B1 * 7/2003 Watkins ........................ 716/103
6,606,532 B1 8/2003 Yasuura et al. ............... 700/117
6,606,588 B1 8/2003 Schaumont et al.
6,618,839 B1 * 9/2003 Beardslee et al. ................ 716/4
6,687,662 B1 2/2004 McNamara et al.
6,760,898 B1 * 7/2004 Sanchez et al. ................. 716/16
6,823,497 B2 * 11/2004 Schubert et al. .................. 716/4
6,842,888 B2 1/2005 Roberts ........................... 716/18

(Continued)

OTHER PUBLICATIONS

The Authoritative Dictionary of IEEE Standards Terms, 7th Ed. © 2000. p. 915.*

(Continued)

*Primary Examiner* — Paul L Rodriguez
*Assistant Examiner* — Russ Guill
(74) *Attorney, Agent, or Firm* — Weaver Austin Villeneuve & Sampson LLP

(57) ABSTRACT

An electronic design automation system merges embedded logic analyzer technology with system level design and analysis technology. Embedded logic analyzers provide hardware to allow board-level signal capture and subsequent analysis of test devices programmed with a hardware design generated using electronic design automation. System level environments provide interactive tools for entering, modeling, simulating and analyzing multi-domain systems such as DSP designs. Typically, a user enters a system level design as a block diagram, including embedded logic analyzer blocks. The user inserts such blocks at nodes in the design where he or she wishes to capture signals to verify the design.

17 Claims, 17 Drawing Sheets

U.S. PATENT DOCUMENTS

| | | | | |
|---|---|---|---|---|
| 6,862,563 | B1 | 3/2005 | Hakewill et al. | |
| 6,883,147 | B1 | 4/2005 | Ballagh et al. | |
| 7,020,854 | B2 | 3/2006 | Killian et al. | |
| 7,085,702 | B1 | 8/2006 | Hwang et al. | 703/15 |
| 7,107,567 | B1 | 9/2006 | LeBlanc | 716/17 |
| 7,110,935 | B1 | 9/2006 | Hwang et al. | 703/20 |
| 2002/0049944 | A1 | 4/2002 | Lagoon et al. | |
| 2002/0194543 | A1 * | 12/2002 | Veenstra et al. | 714/39 |
| 2003/0033374 | A1 | 2/2003 | Horn et al. | |
| 2003/0088710 | A1 | 5/2003 | Sandhu et al. | |
| 2003/0125925 | A1 | 7/2003 | Walther et al. | |
| 2003/0154465 | A1 | 8/2003 | Bollano et al. | |
| 2003/0200522 | A1 | 10/2003 | Roberts | |
| 2003/0204388 | A1 | 10/2003 | Rodriguez et al. | |
| 2005/0065990 | A1 | 3/2005 | Allen | |
| 2005/0166038 | A1 | 7/2005 | Wang et al. | |
| 2006/0117274 | A1 | 6/2006 | Tseng et al. | 716/1 |

OTHER PUBLICATIONS

Ha, Dong. "Simulation Graphical Environment User's Guide Using the VHDL Interface." Last Updated Oct. 1, 1998. http://www.ee.vt.edu/~ha/cadtools/synopsys/sge_tutorial/tutorial.html.*

"Synopsys® SourceModel User's Manual for VHDL." Apr. 1999. pp. 1-15 and 95-106.*

"Dong S. Ha, Professor." Printed Jun. 15, 2006. http://www.ee.vt.edu/ha.*

Xilinx®. "ChipScope Pro Software and Cores User Manual." Apr. 10, 2002.*

"Simulink: Dynamic System Simulation for MATLAB®." Version 3. Jan. 1999.*

"Formal Verification Flow for Xilinx Devices Using the Synplify Pro® Software and the Conformal™ LEC Tool." Mar. 2003. http://www.synplicity.com/literature/pdf/formal_verification_final.pdf.*

Paul Graham et al., "Instrumenting Bitstreams for Debugging FPGA Circuits", 2001, Proceedings of the 9th Annual IEEE Symposium on Field-Programmable Custom Computing Machines, ten unnumbered pages.*

Altera, "SignalTap Embedded Logic Analyzer Megafunction", Apr. 2001, Altera, pp. 1-8.*

Description of DSP design from the MathWorks website (www.mathworks.com/products/dsp-comm/topdown.shtml); available prior to May 31, 2002.

Description of Xilinx System Generator for Simulink; Product and Description available prior to May 31, 2002.

Description of DSP Builder product available from Altera Corporation; description appears at www.altera.com/products/software/system/dsp/dsp-builder.html; available prior to May 31, 2002.

Altera DSP Builder User Guide; available prior to May 31, 2002.

Simulink Fixed-Point Blockset, User's Guide, Version 3; Product and Description available prior to May 31, 2002.

Molson et al., "Bit Accurate Hardware Simulation in System Level Simulators," U.S. Appl. No. 10/160,142, filed May 31, 2002, 49 Pages.

Fairman et al., "Gaining Access To Internal Nodes In a PLD," U.S. Appl. No. 09/802,480, filed Mar. 9, 2001, 31 Pages.

Nixon et al., "Chip Debugging Using Incremental Recompilation," U.S. Appl. No. 10/351,017, filed Jan. 24, 2003, 41 Pages.

Rally et al., "PLD Debugging Hub," U.S. Appl. No. 10/295,265, filed Nov. 14, 2002, 37 Pages.

Chin, "Implementing DSP Designs with the Xilinx System Generator and Implementation Tools," Jun. 2001, Syndicated, vol. 1, Issue 2, pp. 1-2.

Holmberg et al, "The MathWorks and Xilinx take FPGAs into Mainstream DSP," New Technologies DSP, Feb. 2001, pp. 14-15.

Kreiner et al., A Novel Codesign Approach based on Distributed Virtual Machines, Institute for Technical Informatics, Mar. 2002.

Mahlke et al., "Bitwidth Cognizant Architecture Synthesis of Custom Hardware Accelerators," 5th International Workshop on Software and Compilers for Embedded Systems, Mar. 2001 IEEE, total pages of 43.

Vink, "Programming DSPs using C: efficiency and portability tradeoffs," Embedded Systems, May 2000, pp. 19-30.

Simulink Fixed-Point Blockset, User's Guide, Version 3; Product and Description available prior to May 31, 2002.

Office Action dated Aug. 24, 2006; U.S. Appl. No. 10/458,516.

Office Action dated Mar. 3, 2006; U.S. Appl. No. 10/458,516.

S. Mahlke, R. Ravindran, M. Schlansker, R. Schreiber, and T. Sherwood, "Bitwidth Cognizant Architecture Synthesis of Custom Hardware Accelerators", herein referred as Sherwood, 5th International Workshop on Software and Compilers for Embedded Systems, Mar. 2001 IEEE, total pages of 43.

Per Holmberg, and Anne Mascarin, "The Meth Works and Xilnx take FPGAs into Mainstream DSP", New Techologies DSP, Feb. 2001, pp. 14-15.

Christian Kreiner, Christian Steger, Egon Teiniker, and Reinhold Weiss, "A Novel Codesign Approach based on Distributed Virtual Machines", Institute for Technical Informatics, Mar. 2002.

Darin Chin, "Implementing DSP Designs with the Xilnx System Generator and Implementation Tools", Jun. 2001, Syndicated, vol. 1, Issue 2, pp. 1-2.

Xilnx® "ChipScope Pro Software and Cores User Manual", Apr. 10, 2002.

"Simulink: Dynamic System Simulation for MATLAB®" Verson 3. Jan. 1999.

"Formal Verification Flow for Xilinx Devices Using the Synplify Pro® Software and the Conformal™ LEC Tool", Mar. 2003. http://www.synplicity.com/literature/pdf/formal_verificat4ion_final.pdf.

U.S. Office Action dated Nov. 21, 2007 issued in U.S. Appl. No. 10/458,516.

U.S. Office Action dated Sep. 26, 2007, issued in U.S. Appl. No. 10/458,516.

U.S. Office Action dated Nov. 11, 2007, from U.S. Appl. No. 10/458,519.

U.S. Office Action dated Sep. 26, 2007, from U.S. Appl. No. 10/458,519.

Xilinx System Generator for DSP, User Guide, Version 3.1, printed on Jun. 18, 2007, 236 pages.

* cited by examiner

Embedded Logic Analyzer File

E.L.A. Node A

E.L.A. Node B

E.L.A. Node C

⋮

Target Hardware Device = APEX

JTAG Cable = ByteBlasterMV Download Cable

FIGURE 2C

```
library ieee;
use ieee.std_logic_1164.all;
use ieee.std_logic_signed.all;

library dspbuilder;                                  403
use dspbuilder.dspbuilderblock.all;

library lpm;
use lpm.lpm_components.all;

Entity switch_control is
        Port(
                clock          :       in std_logic;
                iSWITCH0s      :       in std_logic;
                iSWITCH1s      :       in std_logic;              405
                iSWITCH2s      :       in std_logic;
                iSWITCH3s      :       in std_logic;
                clk_out        :       out std_logic;
                oLED0s         :       out std_logic) ;
end switch_control;

architecture aDspBuilder of switch_control is


signal sclr          :       std_logic: = '0' ;

--Using PLL to drive pin Y3 (DAC clock source)
component dspboard200_pll PORT(
                             inclk0       :       IN STD_LOGIC ;
                             c0     :     OUT STD_LOGIC) ;
end component ;

signal board_clk_out_int   :     std_logic;

signal   A0W      :       std_logic_vector(8 downto 0) ;
signal   A1W      :       std_logic ;
signal   A2W      :       std_logic ;
signal   A3W      :       std_logic ;                              407
signal   A4W      :       std_logic ;
signal   A5W      :       std_logic_vector(8 downto 0) ;
signal   A6W      :       std_logic ;
signal   A7W      :       std_logic ;
signal   A8W      :       std_logic ;
```

*FIGURE 4A*

```
signal    A9W    :    std_logic;
signal    A10W   :    std_logic_vector (8 downto 0) ;
signal    A11W   :    std_logic;
signal    A12W   :    std_logic;
```
407

```
Begin

assert (1<0)  report altversion severity Note;

-- Output  -  I/O assignment from Simulink Block
"LED0"
oLED0s     <=     A9W;
sclr   <=    '0' ;

--  Input – I/O assignment from Simulink Block
"iSWITCH0s"
A1W        <=     iSWITCH0s ;

--  Input – I/O assignment from Simulink Block
"iSWITCH1s"
A2W        <=     iSWITCH1s ;

--  Input – I/O assignment from Simulink Block
"iSWITCH2s"
A3W        <=     iSWITCH2s ;

--  Input – I/O assignment from Simulink Block
"iSWITCH3s"
A4W        <=     iSWITCH3s ;


--  Constant assignment  – Simulink Block "CNST_GND"
A0W (8)              <=     '0' ;
A0W (7 downto 0)           <=     "00000000" ;
A5W (8)                    <=     '0' ;
```
409

```
-- Using PLL to drive pin Y3 (DAC clock source)
uclklk_out2p  : dspboard200_pll port map (inclk0  =>
clock, c0      => board_clk_out_int) ;
clk_out          <=    board_clk_out_int ;
```

*FIGURE 4B*

```
-- Incrementer-Decrementer – Simulink Block
"EightBitCounter"
EightBitCounteri    : IncDec generic map (
                      LPM_WIDTH=> 8,
                      cst_val=> "00000000" ,
                      lpm=>0 ,
                      unsigned=>1,
                      SequenceLength=>1,
                      SequenceValue=>1,
                      direction=>0)
                    port map (
                      clock       =>clock,
                      ena         =>     '1'
                      sclr        =>     sclr,
                      result      =>     A5W (7 downto 0));
```
⎫
⎬ 411
⎭

```
-- Compare Operator – Simulink Block "Comparator"
Comparatori : Comparator generic map (
              LPM_WIDTH => 9,
              DIRECTION=> Altaeb,
              LPM=> 0)
            port map (
              DATAA       =>     A10W,
              DATAB       =>     A0W,
              result      =>     A6W) ;
```
⎫
⎬ 413
⎭

```
-- Logical Bit Operation – Simulink Block "AND_Gate1"
ANDGate1i   : SBitLogical  generic map (
              LPM_WIDTH => 2,
              LOP =>AltAND)
            port map (
              dataa(0)   =>   A2W,
              dataa(1)   =>   A1W,
              result     =>   A7W) ;
```
⎫
⎬ 415
⎭

```
-- Logical Bit Operation – Simulink Block "AND_Gate2"
ANDGate2i   : SBitLogical  generic map (
              LPM_WIDTH => 2,
              LOP =>AltAND)
            port map (
```
⎫
⎬ 417
⎭

FIGURE 4C

```
                    dataa(0)  =>  A3W,          } 417
                    dataa(1)  =>  A4W,
                    result  =>  A8W) ;

-- Logical Bit Operation – Simulink Block "OR_Gate"      } 419
ORGatei  :  SBitLogical generic map (
                    LPM_WIDTH  =>  3,
                    LOP  => AltOR)
               port map  (
                    dataa(0)  =>  A11W,
                    dataa(1)  =>  A12W,
                    dataa(2)  =>  A6W,
                    result  =>  A9W);

-- Signal TAP – Simulink Block "cntout"                  } 421
ucntout : signaltapunit generic map (
                    upper_limit   => 8,
                    lower_limit   => 0)
                    port map (
                    data_in  =>        A5W,
                    data_out =>        A10W) ;

-- Signal TAP – Simulink Block "firstandout"             } 423
ufirstandout : signaltapunit generic map (
                    upper_limit   => 0,
                    lower_limit   => 0)
                    port map (
                    data_in  =>        A7W,
                    data_out =>        A11W) ;

-- Signal TAP – Simulink Block "secondandout"            } 425
usecondandout : signaltapunit generic map (
                    upper_limit   => 0,
                    lower_limit   => 0)
                    port map (
                    data_in(0)  =>          A8W,
                    data_out(0) =>          A12W) ;

end architecture aDspBuilder;
```

FIGURE 4D

EMBEDDED LOGIC ANALYZER FUNCTIONALITY FOR SYSTEM LEVEL ENVIRONMENTS

AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

This application relates to embedded logic analyzers and system level design environments. More particularly, the invention relates to system level design interfaces that allow users to insert embedded logic analyzers in electronic designs and then analyze outputs of such logic analyzers using system level analysis tools.

Simulink® (available from The MathWorks, Inc. of Natick, Mass.) and similar system level environments allow users to design and simulate Digital Signal Processing Systems (DSPs) and other electronic devices at the algorithm level. In a graphical user interface window, users enter logic blocks and associated connections representing the overall DSP design. The individual logic blocks have associated code for executing the functions of the blocks. During a system level simulation, the simulator executes the code for each individual block to provide a simulation result. Typically, the code is written in C++ or other appropriate compilable language.

Traditional system level simulators simulate a user's algorithm functionally, by executing logic block functions independently of any specific hardware implementation. These simulators typically employ a floating-point numeric representation; they do not provide bit and cycle accurate simulations of the hardware blocks. However, outside the context of traditional system level simulators, various simulation tools are available to verify hardware designs entered by users. And recently, various companies have introduced system level simulation products that allow some measure of hardware development in a system level simulator (specifically Simulink™). These include the "DSP Builder" product from Altera Corporation of San Jose, Calif., the "System Generator for Simulink" available from Xilinx, Inc. of San Jose, Calif., and the Simulink RTW tools available from The MathWorks, Inc. of Natick, Mass. Hence there is a movement toward merging the functionality of conventional system level simulators and conventional EDA (Electronic Design Automation) tools for hardware development. With these new tools, the user can impose some hardware constraints to get a better simulation of the hardware. In fact, some of these products allow bit and cycle accurate system level simulation of hardware designs. See U.S. patent application Ser. No. 10/160,142.

Conventional EDA tools, whether or not coupled with system level simulators, work with register transfer level descriptions of the hardware logic for the various hardware modules comprising a design. From these RTL descriptions, the EDA tools can simulate and verify a hardware design in software.

While the hardware simulation and verification software available with modern system level simulators and conventional EDA tools can often provide results that accurately predict performance of hardware designs, the increasing complexity of such designs reduces the usefulness of this software. For example, for a typical echo canceller design, simulating one hour of real-time operation can take months in software. Also, it is becoming increasingly difficult to obtain real-world stimulus to accurately model a full system design such as that provided as a system on a programmable chip (SOPC). Still further, algorithm designers face the difficulty of having to use more than one tool for various stages of the design cycle (e.g., a system level simulator for high level designs and a conventional EDA simulator for simulations of more specific hardware designs). And in addition to the difficulties in generating a comprehensive simulation, other circuit board variables such as temperature changes, capacitance, noise, and other factors may cause intermittent failures in a device that are only evident when the hardware is operating within a working system.

What is needed therefore is improved system level design interfaces or other tools that can facilitate quick and accurate methods for identifying and analyzing signals generated in a hardware design.

SUMMARY

The present invention merges embedded logic analyzer technology with system level design and analysis technology. Embedded logic analyzers provide hardware to allow board-level signal capture and subsequent analysis of test devices programmed with a hardware design generated using electronic design automation. Thus, a complex electronic design can be verified much faster than would be possible using conventional software-based design verification tools. System level environments provide interactive tools for entering, modeling, simulating and analyzing multi-domain systems such as DSP designs. Typically, a user enters a system level design as a block diagram. Using this invention, embedded logic analyzer blocks can be entered as part of the system level block diagram. The user simply inserts such blocks at nodes in the design where he or she wishes to capture signals to verify the design.

Thus, one aspect of the invention provides a method of providing one or more embedded logic analyzers in a hardware design. Such method may be represented by the following sequence: (a) receiving instructions entered in a system level interface specifying one or more nodes in the hardware design where the one or more embedded logic analyzers are to capture signals; (b) receiving a command entered in the system level interface for converting the hardware design to an HDL representation of the hardware design; (c) converting the hardware design including the one or more embedded logic analyzers to the HDL representation; and (d) causing the HDL representation to be compiled to create a compiled hardware design. This compiled design includes compiled instructions for implementing the one or more embedded logic analyzers. Note that the system level interface presents the hardware design, typically in a graphical depiction, as in a block or schematic diagram. Note also that the HDL representation identifies nodes where signals are to be captured by the one or more embedded logic analyzers. Note also there is not necessarily a one-to-one correspondence between the nodes and the embedded logic analyzers. In a typical case, a single embedded logic analyzer captures signals at multiple separate nodes, each of which is represented by a separate block in the system level interface.

After the method compiles the design, it may also program a target hardware device with the compiled hardware design. This implements the hardware design with one or more embedded logic analyzers on the target hardware device.

It is desirable to allow various operations associated with the electronic design automation process to be implemented via the system level interface. Thus, in certain preferred embodiments, the programming is performed in response to instructions received through the system level interface. In addition, the operation of causing the hardware representation to be compiled is preferably performed in response to user instructions received through the system level interface.

Various parameters may characterize the operation of an embedded logic analyzer. One of these is the set of trigger conditions that must be met before the logic analyzer begins capturing signals. Thus, in some embodiments, the method also requires receiving one or more specified trigger events for capturing signals at the one or more nodes where the one or more logic analyzers are to capture signals. These events are specified by a user via the system level interface and then provided to a target hardware device programmed with the compiled hardware design. Another parameter groups one or more bits of signals at the nodes where the embedded logic analyzers are to be implemented. This causes the one or more bits to be captured at the one or more embedded logic analyzers. In a preferred embodiment, the system level interface may receive a user command to define such grouping. Yet another relevant parameter that can be specified via the system level interface is a radix for signals captured at least one node of the embedded logic analyzer(s).

Another aspect of the invention provides a method of analyzing the operation of a hardware device at one or more nodes in communication with one or more embedded logic analyzers. Thus, this aspect of the invention assumes that a logic analyzer has already been implemented in a target hardware device. This analyzer may have been implemented via a system level environment as described above. Alternatively, it may have been implemented by some other technique. In any event, the method of this aspect of the invention may be characterized by the following sequence of operations: (a) receiving one or more specified trigger events for capturing signals at the one or more nodes in the hardware device where the one or more embedded logic analyzers are to capture signals; (b) determining that the one or more trigger events have been met in the hardware device; (c) capturing the signals with the one or more nodes after making the determination in (b); (d) in response to instructions received at a system level interface, transferring data representing the captured signals to a system level design environment; and (e) analyzing the data representing the captured signals with a system level analysis tool of the system level design environment.

Preferably, the trigger events are specified via the system level interface. Examples of the specified trigger events include the following logic conditions detected at the one or more nodes: low signal value, high signal value, rising edge of a signal, falling edge of a signal, either edge of a signal, and any condition.

Examples of the system level analysis tools include tools for performing Fourier analyses, power spectral density estimations, cross spectral density estimations, discrete cosine transforms, chirp-z transforms, Hilbert transforms, resampling, time-frequency analysis, correlation coefficient computation, covariance computation, and the like.

Yet another aspect of the invention pertains to apparatus and computer program products including machine-readable media on which are provided program instructions and/or arrangements of data for implementing the methods and software systems described above. Frequently, the program instructions are provided as code for performing certain method operations. Data, if employed to implement features of this invention, may be provided as data structures, data objects, or other appropriate arrangements of stored information. Any of the methods or systems of this invention may be represented, in whole or in part, as such program instructions and/or data provided on machine-readable media.

These and other features and advantages of the invention will be presented in more detail below with reference to the associated drawings.

BRIEF DESCRIPTION OF THE DRAWINGS

FIG. 2C is a simple depiction of an embedded logic analyzer file that may be generated in accordance with an embodiment of this invention to instruct a compiler to create programming for implementing an embedded logic analyzer on a target hardware device.

FIG. 3B shows an example of a basic design, prior to insertion of embedded logic analyzer blocks.

FIGS. 4A-4D are sequential lines of HDL code generated to implement the design depicted in FIG. 3C.

DETAILED DESCRIPTION

Introduction

As indicated, the present invention provides system level user interfaces (and associated computational resources) for entering embedded logic analyzers in electronic designs. The interfaces and computational systems also allow convenient analysis of signals captured by embedded logic analyzers. System level environments typically have rich sets of system level analysis tools for this purpose.

Figure 3A:
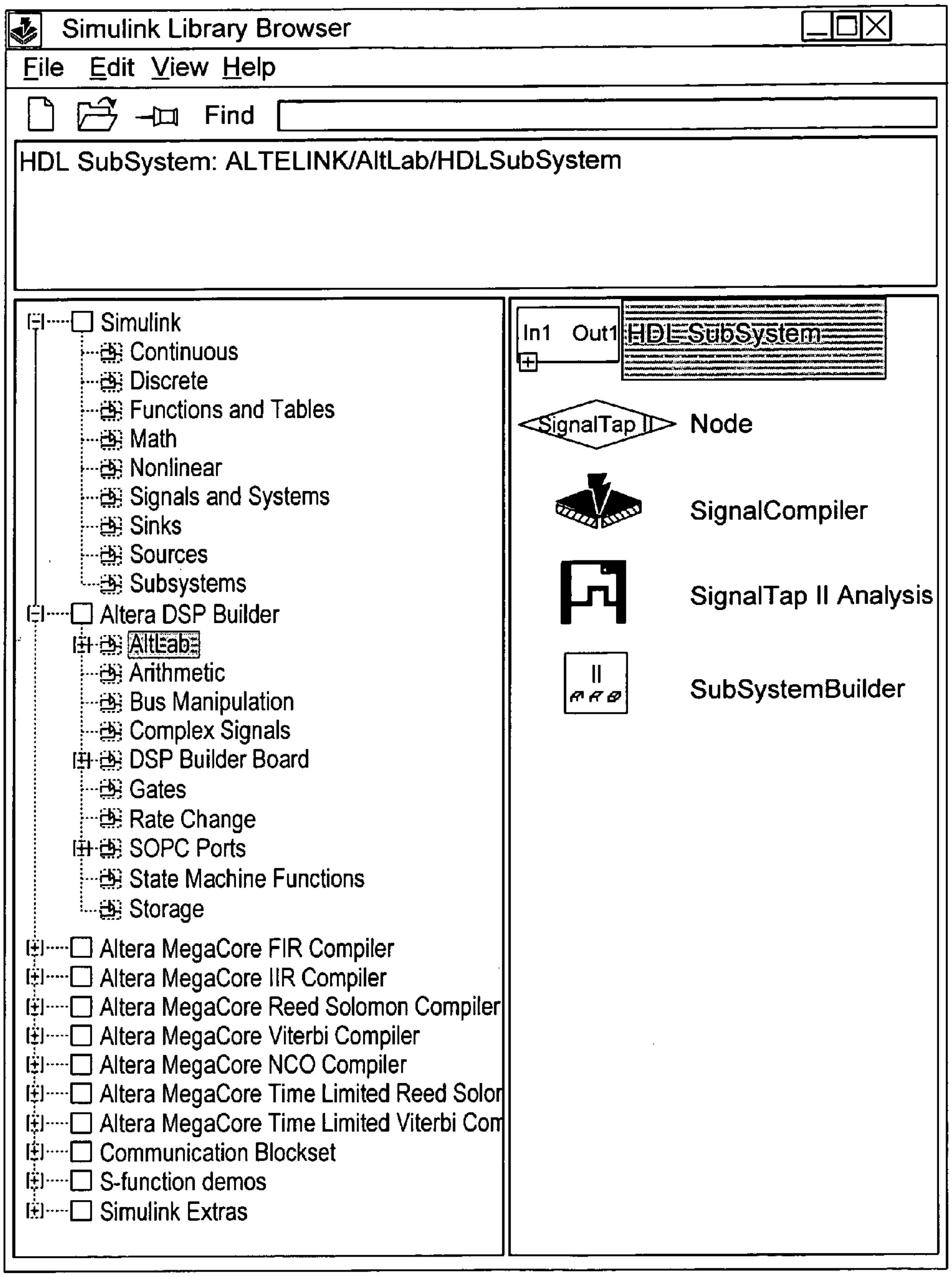
FIG. 3A is a directory of features, including generic embedded logic analyzer blocks that may be selected to create a hardware design using a system level design interface.
Figure 3B:
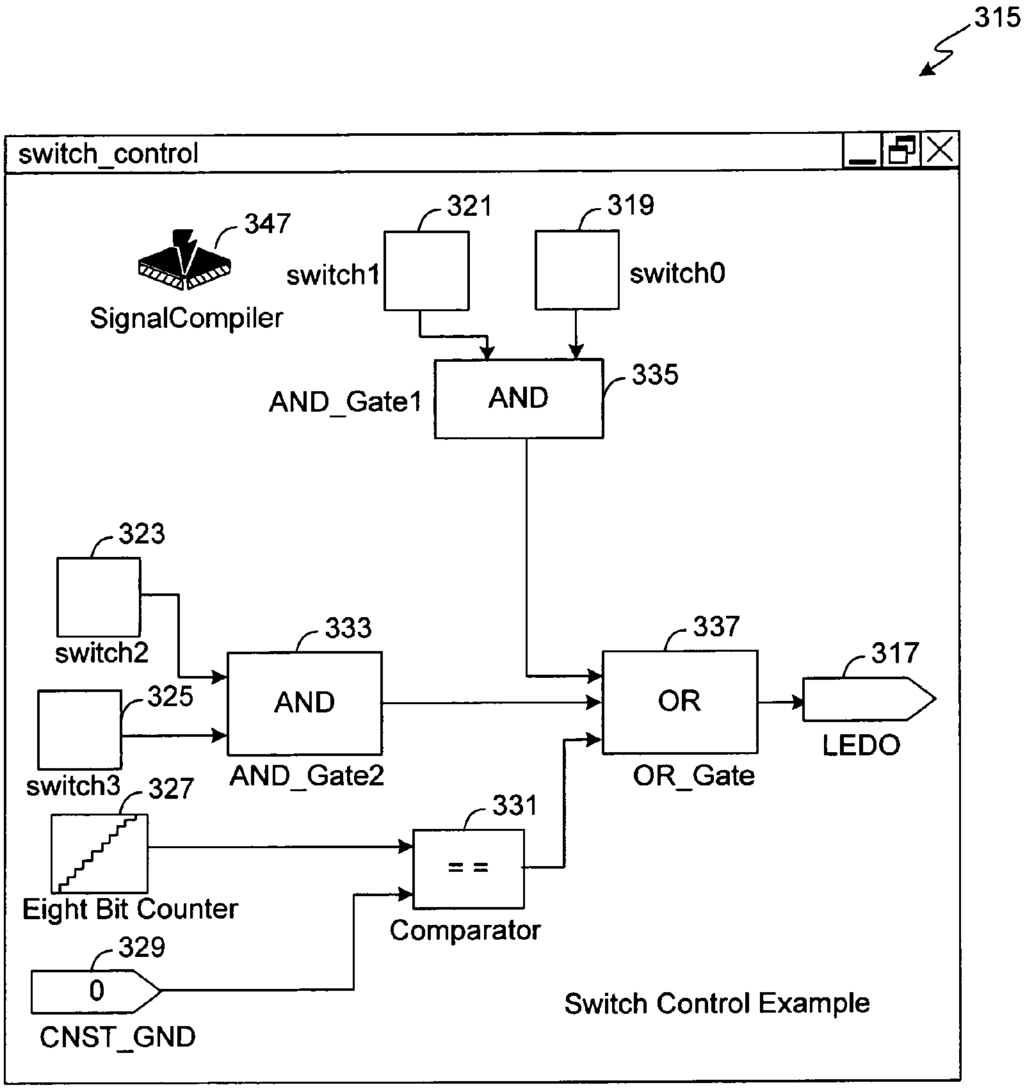
FIG. 3B is a window of a system level interface where a block diagram of a hardware design is entered and displayed.
Figure 3C:
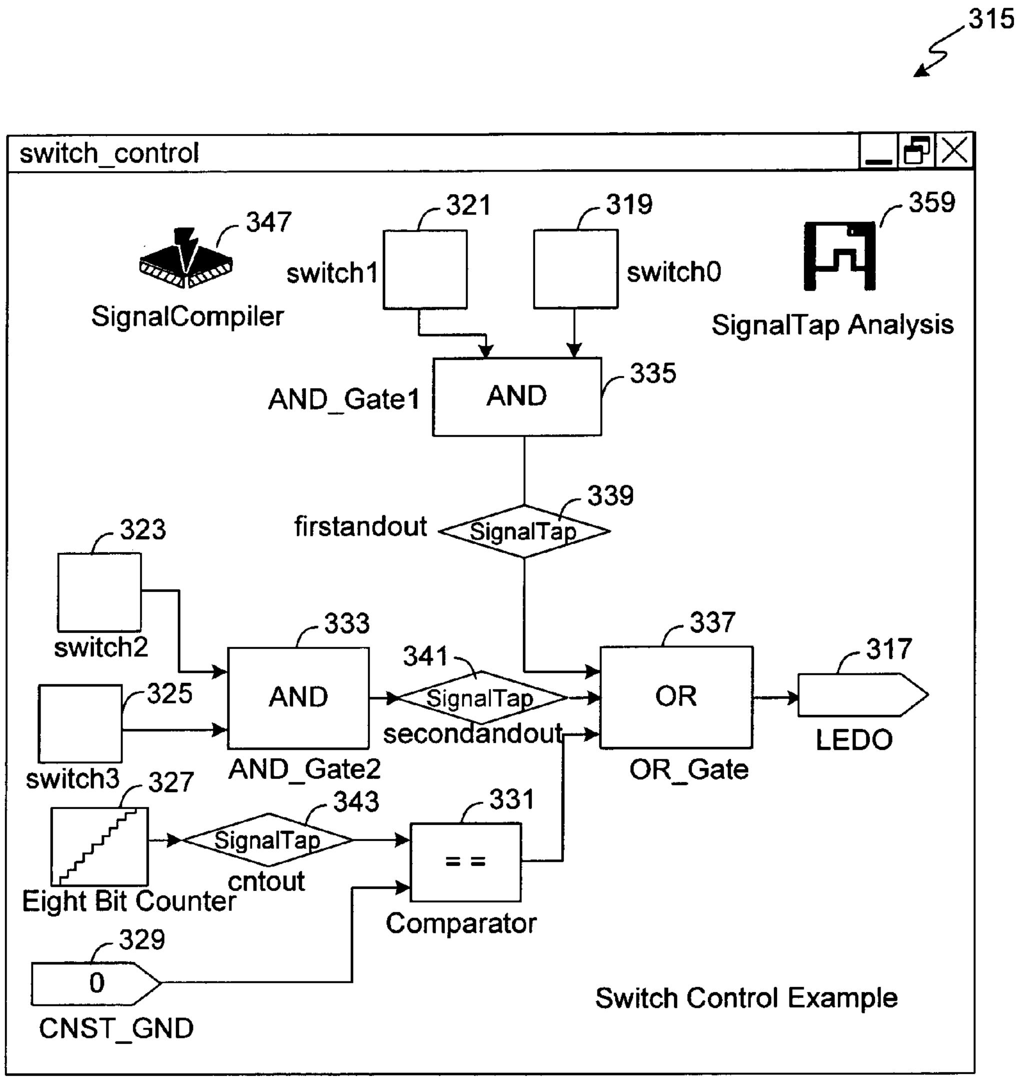
FIG. 3C is another view of the window in FIG. 3B, but after embedded logic analyzer blocks have been entered at desired positions in the design.
Figure 3D:
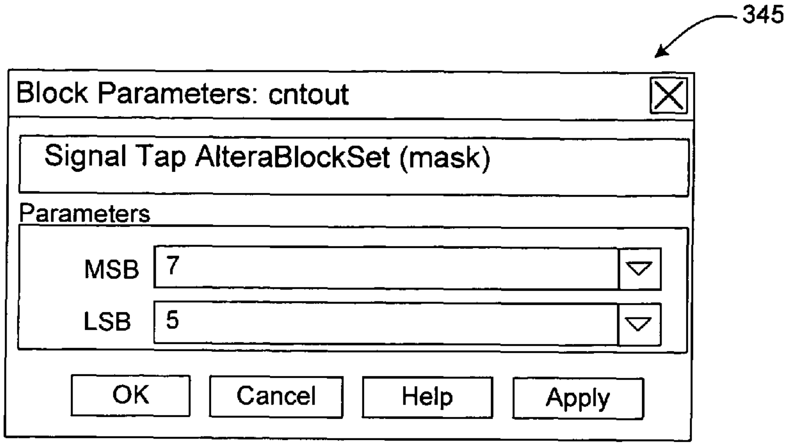
FIG. 3D is “mask block” displayed by the system level interface to allow the user to select a range of bits within a particular signal for capture by an embedded logic analyzer.
Figure 3E:
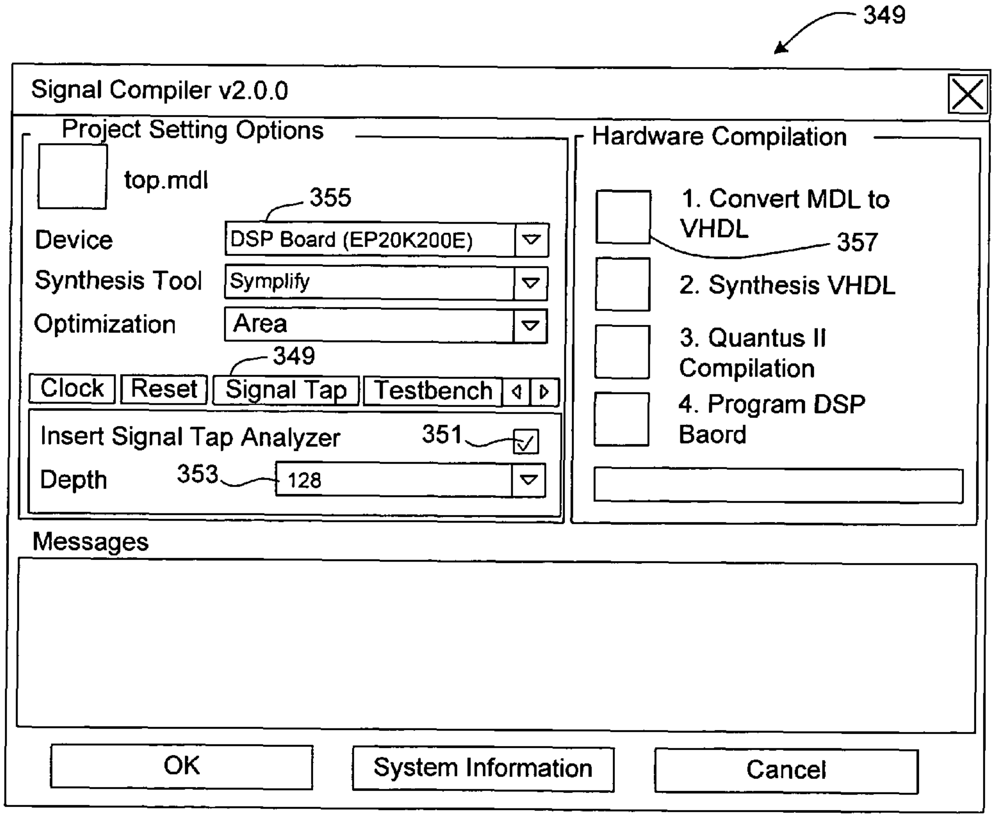
FIG. 3E is a “signal compiler” window presented by the system level design interface that allows the user to select various compilation parameters—including specification of an embedded logic analyzer depth.

As a simple example of how the present invention may be implemented, consider FIGS. 3B, 3C, and 3E. FIG. 3B shows a simple hardware design entered in a system level design interface window 315 (in this case, a Simulink window comprising an Altera DSP Builder signal compiler icon 347). The design itself comprises an incrementer function 327 feeding a comparator 331, and four switches 319, 321, 323, and 325 fed into two AND gates 333 and 335. The comparator and AND gates outputs feed an OR gate 337, which feeds an LED 317 on a target hardware device. Now assume that the user wishes to perform on-board verification of this design. He or she enters embedded logic analyzer blocks at hardware nodes where signals are to be captured. These blocks are entered via a graphical user interface that allows the user to drag and drop such blocks to appropriate locations on the hardware design. As shown in FIG. 3C, the embedded logic analyzers are represented by "SignalTap™" blocks 339, 341, and 343 at the selected nodes in the depicted hardware design. The user can then cause the design to be synthesized, compiled and/or programmed using the functionality accessed though the signal compiler icon 347. These functions are depicted in a signal compiler window 349 shown in FIG. 3E. All synthesis, compilation, and programming includes the embedded logic analyzer blocks integrated with the remainder of the hardware design entered by the user.

As explained in more detail below, the invention also provides a user interface and associated computational resources to set parameter values defining the functioning of the embedded logic analyzers. Further, the invention provides mechanisms for transferring signals captured by the embedded logic analyzers to system level analysis tools to facilitate board level verification. This feature will also be explained in more detail below.

From the above discussion, the meanings of certain relevant terms should be reasonably clear. However, to further illuminate certain concepts pertinent to this invention, the following definitions are provided. These definitions are provided to assist in understanding the concepts presented in the specification. They do not necessarily limit the scope of this invention.

Generally, "system level interfaces" provide a computational medium for inputting and interacting with system level designs (frequently DSP designs). As with other computer interfaces, they allow users to enter, manipulate, move, and delete features of a project or design. This is accomplished via user interaction components such as (i) input mechanisms (e.g., keyboards, voice recognizers, mice, track pads, styluses, and the like), (ii) presentation mechanism (e.g., audio, video, and/or tactile), and (iii) software controlling the receipt of user inputs and responsive presentation. A typical computer display based user interface of this invention presents various conventional GUI features such as windows, icons, check boxes, buttons, scroll bars, and the like. A user may enter and manipulate system level designs using conventional techniques such as "dragging and dropping," single and double "clicking," keyboard shortcuts, menu selections, and the like.

Via system level interfaces, users enter abstract process blocks (modules) representing various components of an algorithm. Often the blocks themselves are not intrinsically linked to any particular hardware. Hence, in traditional system level designs, the various modules comprising a design are not constrained to particular word formats, and the system level simulators simulate the various process blocks employing a floating-point representation of the input and output signals. Lower level design capture mechanisms may map these user-entered blocks to particular hardware modules. Modern system level design environments allow users to specify some level of hardware constraints such as limited word sizes, etc.

The Simulink™ product available from The MathWorks, Inc. provides a widely used system level design interface. Throughout this specification, Simulink is used as an example. However, this invention is not limited to Simulink or any other commercial or proprietary system level environment. Further, the invention applies to both enhancements of existing system level products (such as Simulink) and completely new system level products designed from the ground up. Either way, the system level design environments of this invention preferably allow conventional algorithm design and simulation as well as hardware design and simulation. Generally, though not necessarily, system level design interfaces are implemented as software running on a general-purpose microprocessor. Simulink, for example, is a software application that can run on Intel Pentium® processors.

Typically, a system level design interface is but one component of a larger system level environment that may include (a) a system level workspace for providing variables and data in a format that be used by other aspects of the system level environment, (b) system level analysis tools for performing detailed analysis of data pertaining to designs entered in a system level interface, and (c) a system level simulator for simulating system level designs.

System level simulators are programs that can dynamically execute an abstract design description. Given a description of the circuit and a model for how the elements of the description behave, the simulator maps an input stimulus into an output response, often as a function of time. Simulators generally exist for all levels of design description, from the most abstract behavioral level through the detailed transistor level. System level simulators simulate the most abstract, algorithmic level of design.

System level analysis tools act on variables and data provided to system level workspaces. Examples of the system level analysis tools include tools for performing Fourier analyses, power spectral density estimations, cross spectral density estimations, discrete cosine transforms, chirp-z transforms, Hilbert transforms, resampling, time-frequency analysis, correlation coefficient computation, covariance computation, and the like. Various useful system level analysis tools are available in the MathWorks MATLAB™ and Simulink™ system level environment. They are also available from other vendors, as with the SPW (signal processing worksystem) platform available from Cadence Design Systems, Inc. of San Jose, Calif. In the context of this invention, system level analysis tools may be used to analyze signals captured by embedded logic analyzers.

During system level design or analysis, a set of variables is created to represent the design being created or signals being analyzed. In a system level environment, these variables may be collectively referred to as a "system level workspace." The workspace variables are maintained in memory during a design or analysis operation. Typically, these variables can be viewed using a browser or other interface tool. In one example pertinent to this invention, individual signals captured by embedded logic analyzers in a hardware design represent at least some of the variables that make up a workspace. The system level analysis tools operate on workspace variables.

Embedded logic analyzers (ELAs) are hardware blocks incorporated "on-chip" into a hardware design for capturing particular signals on a test hardware device running at normal operational speed. An ELA can verify that a programmable logic design performs as expected when implemented in hardware. Embedded logic analyzers typically comprise logic for capturing signals at particular locations on a programmable chip when certain trigger conditions are detected on a chip. These trigger events are specified by a user. The signals are temporarily stored on the embedded logic analyzer to a specified buffer depth. Alternately, the signals are routed to the chip's I/O pins directly, without using on-chip memory resources. In this case, an external logic analyzer or other device receives the signals and stores them or displays them (as with an oscilloscope).

Under the appropriate conditions, the captured signals are streamed off chip for analysis. In accordance with certain embodiments of this invention, the signals are provided as workspace variables for use with system level analysis tools. Of course, in other embodiments, the signals are provided to non-system level analysis tools such as waveform editor software in Quartus® II software. Examples of embedded logic analyzers that may be employed with the present invention are described in U.S. Pat. No. 6,182,247 issued Jan. 30, 2001. The Quartus® and Quartus® II design software available from Altera Corporation allow users to include embedded logic analyzers in hardware designs using Altera's predesigned SignalTap megafunction and a JTAG communications cable. Embedded logic analyzers allow users to perform what is known as "board-level verification." Generally, board-level verification allows the user to perform real time simulations of certain internal device nodes in a hardware platform.

The actual gate level representation of a particular logic analyzer circuit will depend upon the particular target device in which the logic analyzer will be embedded. For example, the hardware device in which to embed the logic analyzer may include any of the PLD devices available from Altera Corporation and other PLD vendors. Embedded logic analyzer blocks are typically implemented in available on chip resources such as logic elements and RAM. Embedded memory is particularly well suited for implementing a large FIFO (first in first out) memory for the logic analyzer. For a device without embedded memory, the memory elements (such as SRAM flip-flops) of logic cells may be used for the memory of the logic analyzer but the FIFO buffer may have to be divided over multiple cells if the memory in a single cell is not sufficiently large to accommodate the buffer. Similarly, a device based upon EEPROM technology may also use one or more of its logic cells for the logic analyzer's buffer. A device having large embedded memory works particularly well with the present invention because of the larger capacity for signal storage. Generally, designs for embedded logic analyzers may be created from scratch or selected from pre-created functions or megafunctions.

Generally, an embedded logic analyzer communicates with an external computer from which it may receive commands and other information, and to which it transfers information including the current status of logic analyzer and data captured from the PLD. Such communication may take place in a wide variety of forms such as by use of pins for data in, data out, mode select, clock, status, set trigger, etc.

The embedded logic analyzer may include one or more state machines such as a trigger state machine (which may be "armed", "running", or "full") and a debug state machine, comparators, counters, registers, buffers, multiplexers, and the like. One example of a suitable design is presented in U.S. Pat. No. 6,182,247. Of course, many variations on the design of embedded logic analyzers may be employed depending upon a variety of factors well understood to those of skill in the art.

A system level design including embedded logic analyzers, as created using this invention, is typically converted to instructions for implementing the design on a hardware device. This is accomplished using various software functions of electronic design automation. In one widely used EDA approach, these functions include, in addition to the system level design interface, a synthesizer, a compiler, an RTL (register transfer level) simulator, and a layout program. As indicated, the interface allows the user to enter and/or modify a block or schematic diagram of an electronic design using the display screen. It may also generate a net list (summary of connections between components) in a Hardware Design Language HDL format. Examples of HDLs include Verilog and VHDL. The syntax of a VHDL description is described in IEEE Standard VHDL Language Reference Manual (IEEE Std 1076-1987).

The synthesizer is a tool that automatically creates one design representation from another. Usually the mapping is from more abstract descriptions into more detailed descriptions, closer to the final form for implementation. For example, a VHDL description could be mapped into a collection of Boolean equations that preserve the behavior of the original specification, while describing the system at a greater level of detail. Frequently, a synthesizer creates a synthesized netlist from the designer's high-level electronic design. Synthesis may remove redundant gates, replace the gates of a sub-network of the design with an equivalent network of newly generated "synthesized gates" and/or otherwise convert the design into a more efficient representation. Various commercially available synthesis tools are known and widely used. One example is the LeonardoSpectrum product available from Mentor Graphics of Wilsonville, Oreg. Another example is the Synplify product available from Synplicity of Sunnyvale, Calif.

The compiler takes the net list as an input, and using a component database puts all of the information necessary for layout, verification, and simulation into an object file or files. The verifier checks the input design (HDL) for design errors, such as multiple outputs connected together, overloaded signal paths, etc. and generates error indications if any such design problems exist. The RTL simulator takes the object file(s) and simulation models, and generates a set of simulation results, acting on instructions, initial conditions, and input signal values provided to it either in the form of a file or user input.

When compilation is complete, a target hardware device is programmed (or otherwise constructed) with the compiled design. Generally, a "target hardware device" is any hardware device on which an EDA designed device is implemented. These devices may be custom integrated circuits (e.g., ASICs), custom configurations for programmable integrated circuits, or general purpose, mass-produced integrated circuits. Many embodiments of the invention employ programmable devices such as programmable logic devices (PLDs) programmable by a user to produce a custom design for that user. Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Altera's Stratix™ devices are examples of PLD target hardware devices. They contain logic elements, memory, and dedicated parallel multiplier circuitry (denoted DSP Blocks). A "development board" is a type of target hardware device used solely to test hardware designs running at speed on real programmed hardware devices. Of relevance to this invention, development boards include embedded logic analyzers that capture specified signals under specified conditions.

In many embodiments described herein, the hardware design at issue is a Digital Signal Processing System (DSP) design. System level interfaces facilitate entry of DSP designs. Generally a DSP is a processing system for manipulating analog information, such as sound, images, or video that has been converted into a digital form. It performs the necessary mathematics for manipulating such information. DSPs may employ a data compression technique as part of the manipulation. Understand that this invention is not limited to DSP applications. Many other categories of electronic design can profit from this invention.

Apparatus and Environment

Generally, embodiments of the present invention employ various processes or methods involving data stored in or transferred through one or more computing devices. Embodiments of the present invention also relate to an apparatus for performing these operations. Such apparatus may be specially constructed to serve as a design interface of this invention, or it may be a general-purpose computer selectively activated or reconfigured by a computer program and/or data structure stored in the computer. The processes presented herein are not intrinsically related to any particular computer or other apparatus. Various general-purpose machines may be used with programs written in accordance with the teachings herein, or it may be more convenient to construct a more specialized apparatus to perform the required method operations. A particular structure generally representing a variety of these machines will be described below.

In addition, embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium (including electronic or optically conductive pathways).

Examples of program instructions include low-level code, such as that produced by a compiler, as well as higher-level code that may be executed by the computer using an interpreter. Further, the program instructions may be machine code, source code and/or any other code that directly or indirectly controls operation of a computing machine in accordance with this invention. The code may specify input, output, calculations, conditionals, branches, iterative loops, etc.

Figure 1A:
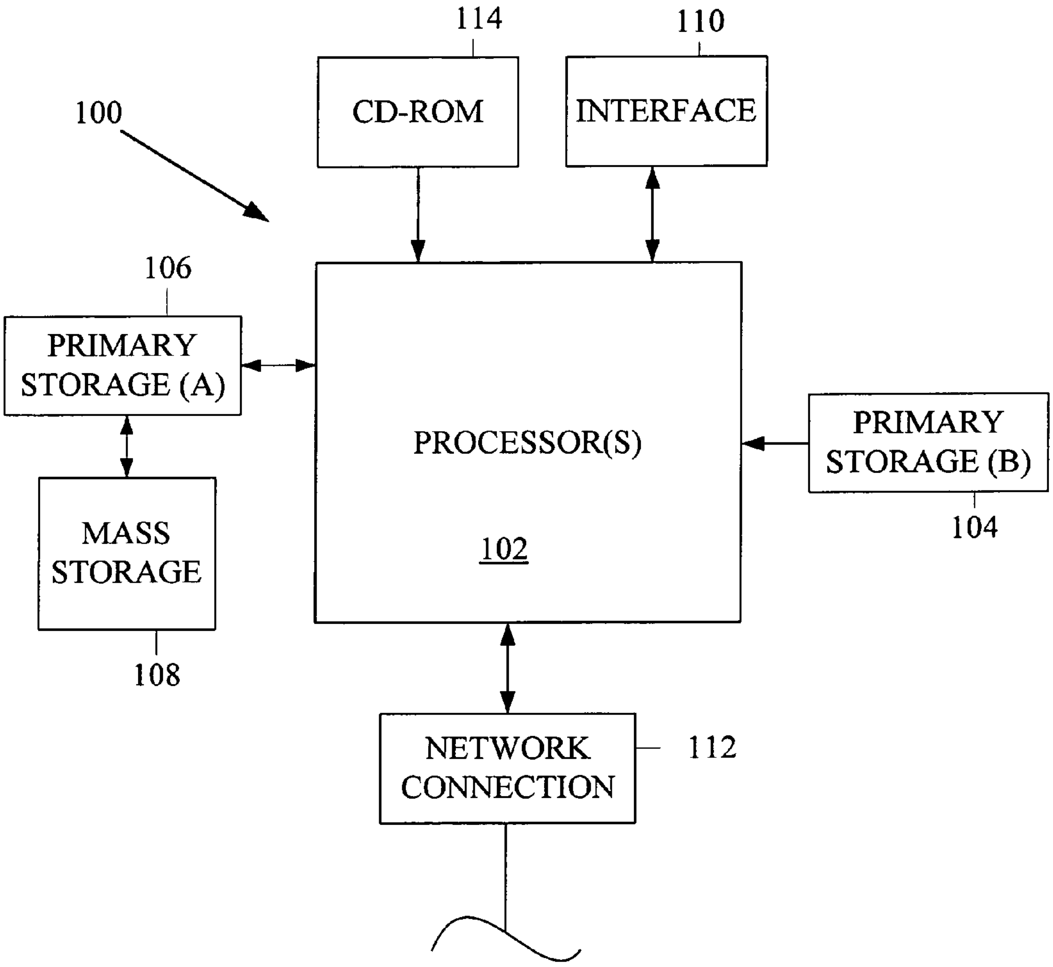
FIG. 1A illustrates a typical computer system that, when appropriately configured or designed, can serve as an apparatus of this invention.

FIG. 1A illustrates, in simple block format, a typical computer system that, when appropriately configured or designed, can serve as a computational apparatus of this invention. The computer system 100 includes any number of processors 102 (also referred to as central processing units, or CPUs) that are coupled to storage devices including primary storage 106 (typically a random access memory, or RAM), primary storage 104 (typically a read only memory, or ROM). CPU 102 may be of various types including microcontrollers and microprocessors such as programmable devices (e.g., CPLDs and FPGAs) and non-programmable devices such as gate array ASICs or general-purpose microprocessors. In the depicted embodiment, primary storage 104 acts to transfer data and instructions uni-directionally to the CPU and primary storage 106 is used typically to transfer data and instructions in a bi-directional manner. Both of these primary storage devices may include any suitable computer-readable media such as those described above. A mass storage device 108 is also coupled bi-directionally to primary storage 106 and provides additional data storage capacity and may include any of the computer-readable media described above. Mass storage device 108 may be used to store programs, data and the like and is typically a secondary storage medium such as a hard disk. Frequently, such programs, data and the like are temporarily copied to primary memory 106 for execution on CPU 102. It will be appreciated that the information retained within the mass storage device 108, may, in appropriate cases, be incorporated in standard fashion as part of primary storage 104. A specific mass storage device such as a CD-ROM 114 may also pass data uni-directionally to the CPU or primary storage.

CPU 102 is also coupled to an interface 110 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 102 optionally may be coupled to an external device such as a database or a computer or telecommunications network using an external connection as shown generally at 112. With such a connection, it is contemplated that the CPU might receive information from the network, or might output information to the network in the course of performing the method steps described herein.

In accordance with this invention, a system such as computer system 100 is used as an electronic design automation tool that provides a system level design interface that facilitates design of test hardware having embedded logic analyzers. Preferably, system 100 also provides system level analysis capabilities and, optionally, one or more of a synthesizer, a compiler, and a target device programmer. Information and programs, including configuration information files and other files can be provided via a network connection 112 for downloading by the designer. Alternatively, such information, programs and files can be provided to a designer on a storage device.

Figure 1B:
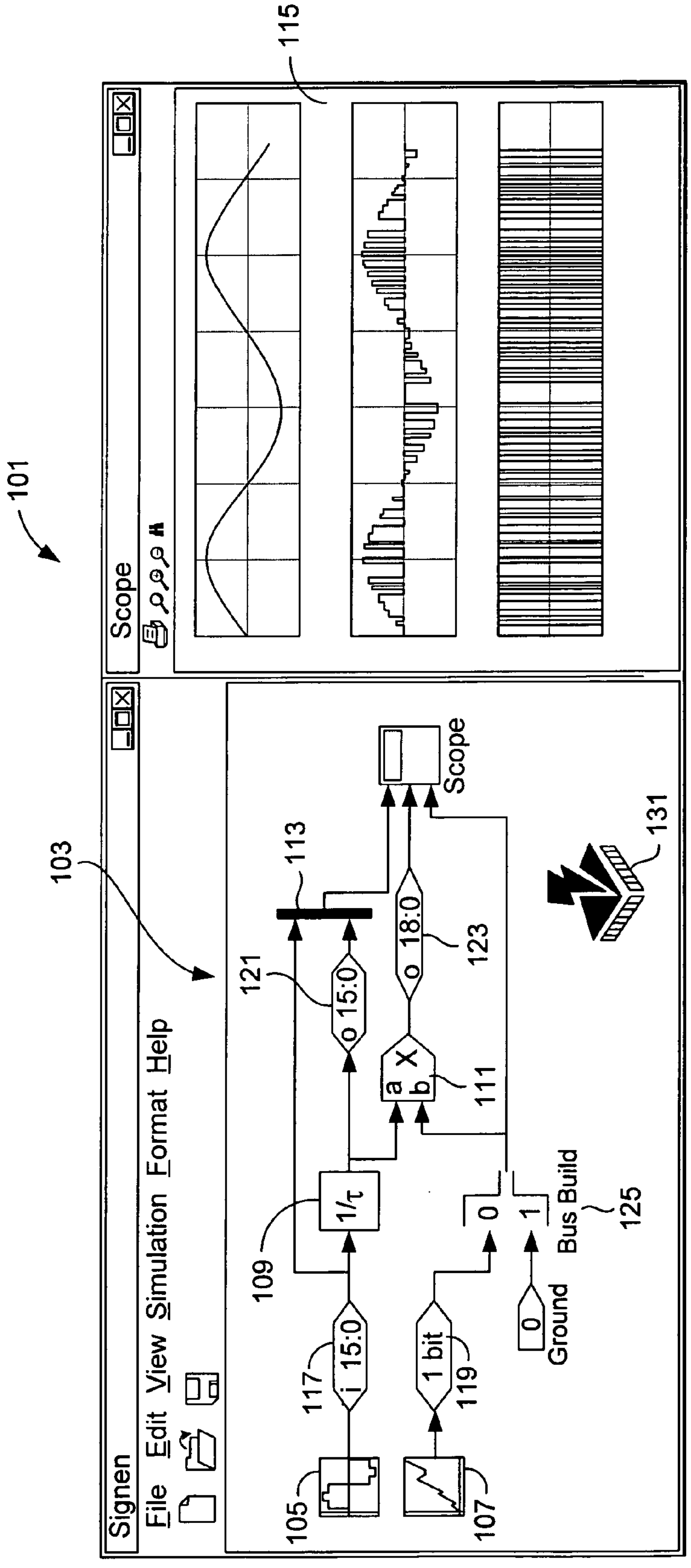
FIG. 1B presents a graphical user interface window (with a sample hardware design) for a system level simulator that makes use of the present invention.

FIG. 1B depicts an example of a hardware design entered in a system level design interface (Simulink in this example). In this simple example, the hardware design represents an amplitude modulation model. On the left hand side of a user interface window 101 (for the system level simulator) the user has input various blocks that together comprise the amplitude modulation model. A sine wave generator 105 and a random bit stream input 107 on the far left side provide the signal inputs. A delay module 109, a multiplier module 111, and a multiplexer module 113 perform the necessary signal manipulations. A scope block 115 on the right side of user interface window 101 presents simulation results for three signals of interest.

In this example, the hardware design includes four separate "word format modules" 117, 119, 121, and 123 (also identified as "AltBuses" herein) that specify a word type and a word size for certain of the signals appearing on the connections of the amplitude modulation model. These word format modules constrain the design to particular word formats, which might otherwise be represented as double precision floating point values by the system level simulator. These word format modules therefore constrain the simulator to conduct its simulation using the words specified for the hardware design. A related module, bus build module 125, constructs a bus from bit inputs: ground and a random bitstream in this case.

The remainder of this document will describe software (1) for entering various modules, including embedded logic analyzer modules, comprising a hardware design in a system level design interface, (2) for compiling such hardware design, (3) for programming such hardware design, and (4) for analyzing signals captured by embedded logic analyzers using system level analysis tools. The document will also explain how certain aspects of this invention integrate algorithm development, simulation, and verification capabilities of a system level environment (e.g., The MathWorks MATLAB and Simulink system-level design environment) with HDL synthesis, simulation, compilation, and verification capabilities of a conventional EDA environment (such as the those employed to design and verify programmable chips).

Figure 1C:
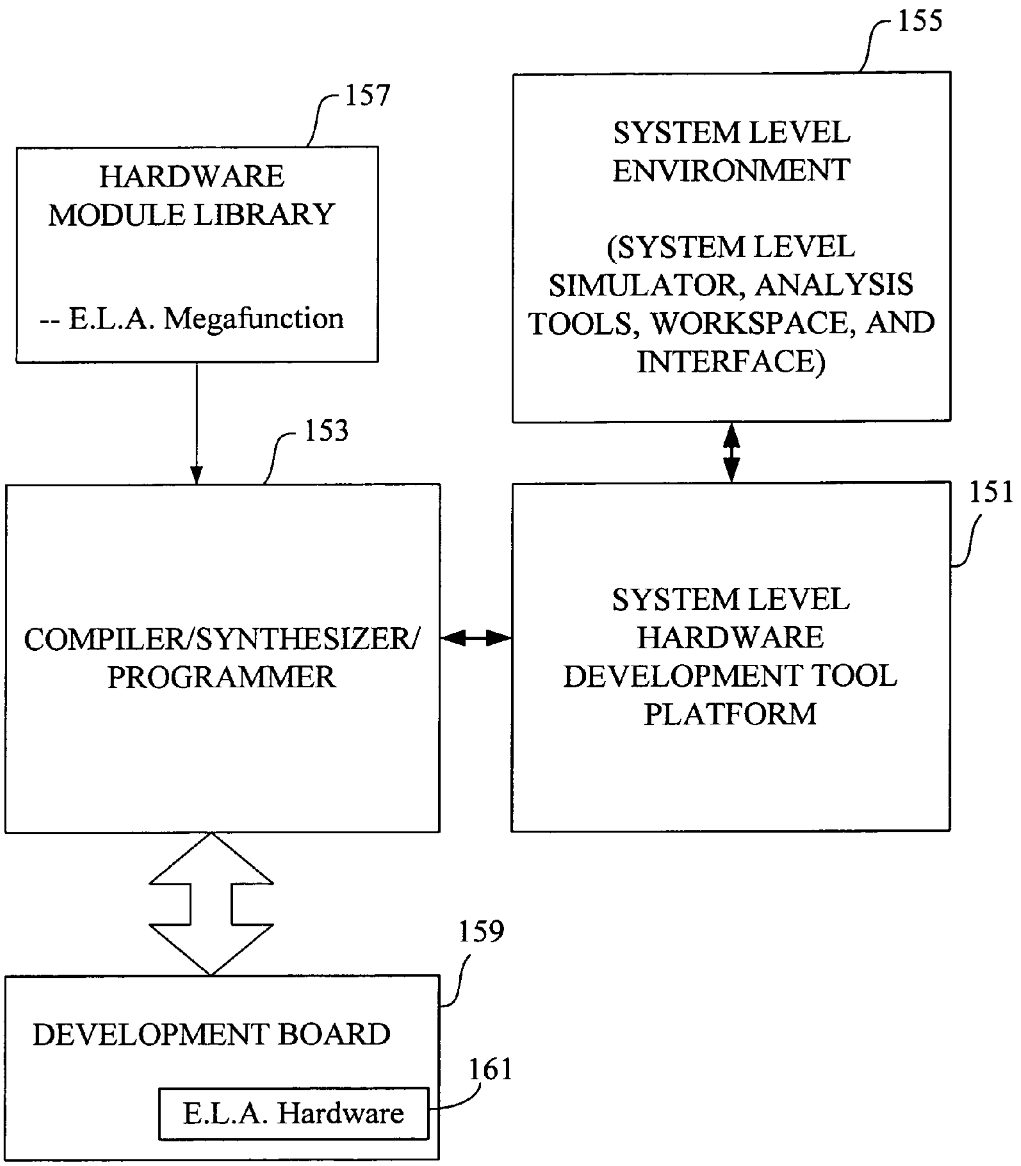
FIG. 1C is high-level block diagram of a computer system in accordance with an embodiment of this invention.

FIG. 1C presents a high level depiction of certain software applications or routines that may work together to implement the present invention. Central to the depicted arrangement is a system level hardware development platform 151. This platform links existing software components: a compiler 153 and a system level environment 155. In many cases, compiler 153 includes or incorporates other EDA tools such as a synthesizer or a hardware programmer. As an example, Altera's Quartus and Quartus II design tools provide suitable compilers, and associated EDA software. The system level environment 155 typically includes a system level simulator, analysis tools, workspace, and interface. As explained, Simulink is a commonly used system level environment.

In this example, compiler 153 supports hardware designs that include embedded logic analyzers. These may be obtained, precompiled, from a library 157 of functions or megafunctions available to the human designer. System level hardware development platform 151 makes these hardware design components available to the system level environment 155 so that users of environment 155 can enter hardware designs comprising such components. Among these components are embedded logic analyzer functions. In some embodiments, platform 151 may be integrated with environment 155 and/or compiler 153 as a single software block. In one specific example, platform 151 is a modified version of Altera's DSP Builder platform.

In operation, platform 151 communicates with environment 155 by an appropriate API. It provides additional features to the graphical user interface that is part of environment 155. Also, in response to an appropriate command, platform 151 converts the user entered hardware design to an HDL representation, and then passes that HDL representation to compiler 153. Compiler 153, in turn, compiles and the design to a programming file containing instructions for programming a blank target hardware device to implement design. This file is sometimes referred to as a "programmer object file" (or .pof file). An appropriate programming tool may then download the programming file to a development board 159 (a target hardware device). As shown, development board 159 includes an embedded logic analyzer 161.

Methodology

Figure 2A:
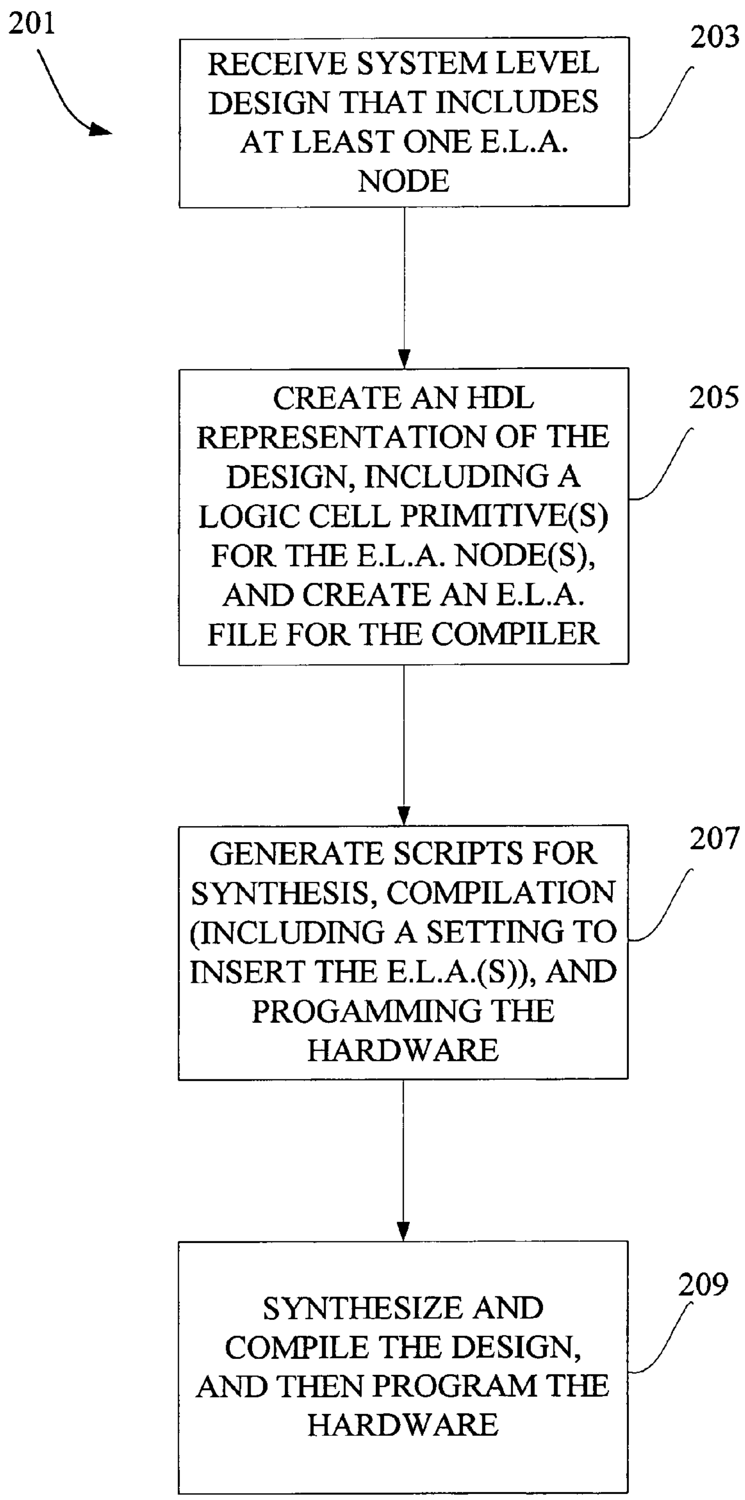
FIG. 2A is a process flow diagram depicting a series of operations that may be employed by a system of this invention in converting user instructions for an embedded logic analyzer to programming for hardware implementing such analyzer.

FIG. 2A presents a process 201 depicting certain operations that may be performed during a typical design project to generate a hardware design including one or more embedded logic analyzers. The process begins at a block 203 where a computer system receives a system level design that includes at least one embedded logic analyzer node. As indicated, a system level design is a design presented in the user interface of a system level environment. In the context of this invention, the system level design includes certain hardware constraints, such as provision of one or more embedded logic analyzers.

The design received at 203 is typically entered by an engineer or other user working with a system level environment such as Simulink. Hence, the user enters her design as a collection of hardware logic blocks connected by signal lines. In addition, the user may specify various specific features and attributes of her embedded logic analyzer block(s). These attributes are specified via the system level interface. As one example, the user can specify which bits of a multi-bit signal to analyze at any given node where an embedded logic analyzer is provided. Or, the user may specify some arbitrary combination of bits captured by one or more of the embedded logic analyzers to combine for presentation to the user. Typically, the user will also specify, again via the system level interface, the depth of a buffer used in an embedded logic analyzer. This, in effect, specifies the number of samples stored by the embedded logic analyzer from signals at the associated nodes. In addition, the system level interface may permit the user to enter one or more trigger conditions for triggering capture of signals at an embedded logic analyzer node. Still further, the user may specify the radix for some or all of the signals captured at the at least one embedded logic analyzer node. Again, this information (the radix) is specified via the system level interface.

In addition to specifying features and attributes characterizing the one or more embedded logic analyzer nodes in hardware design, the system level interface may allow the user to provide additional settings related to general compilation of the overall hardware design. As one example, the interface allows the user to specify a device type as a target hardware device for programming the hardware design. Of interest, in the context of this invention, the target hardware device may be a development board, such as a DSP development board (e.g., the EP20K200E or EP20K1500E development boards available from Altera Corporation). Another compilation parameter specifiable by a user through the system level interface is the choice of a synthesis tool. Various software tools for synthesizing netlists representing hardware design languages are available. Examples include the Synplify tool available from Synplify Corporation and the LeonardoSpectrum tool available from Mentor Graphics Corporation. Still another compilation-type parameter specifiable by a user via the system level interface is an "optimization" type. Various types of optimization may be specified by a compilation tool. For example, the user may chose a compilation routine that minimizes the area occupied by the hardware design on the target hardware device. Alternatively, the user may specify a compilation routine that optimizes the speed at which signals traverse the hardware design. Techniques for effecting these optimizations in a compiler are widely known in the art. Compilers provided with Altera's Max+Plus® II and Quartus® II design tools, for example, present these optimization options.

After the computer system has received the complete hardware design provided at the system level interface, it next creates a hardware design language (HDL) representation of the design. See block 205. This HDL representation includes instances of logic cell primitive for embedded logic analyzer blocks specified in the hardware design. This is essentially a hardware design language specification for implementing the logic required of an embedded logic analyzer in the hardware device. Examples of hardware design languages include Verilog and VHDL. Conventional techniques for generating HDL representations of hardware blocks may be employed to generate the HDL representation of the logic cell instances for an embedded logic analyzer node. A specific example will be described later.

In an example below, HDL code for design shown in FIG. 3C is presented. Note that this code includes descriptions of each of the three embedded logic analyzers, denoted "cntout," "firstandout," and "secondandout." As explained below, the code for each component is generated by parameterizing or instantiating logic block entities, for example. These entities provide unparameterized HDL code for particular logic functions. Other mechanisms for generating HDL descriptions from parameterized block diagrams are well known in the art. In addition to the HDL code, the design tool may require certain other instructions, files, or data to allow compilation of the embedded logic analyzer nodes. This may include a separate embedded logic analyzer file, such as that depicted in FIG. 2C.

Next, pursuant to routine compilation procedures, the computer system generates scripts for directing synthesis, compilation, and creating programmer files for programming the hardware design on to the target hardware device. In one embodiment, the relevant script is written in Tcl. While these scripts may be generated in accordance with standard procedures, in some embodiments it may be appropriate to also notify the compiler that embedded logic analyzers are included in the design so that the designer can optionally specify whether or not to compile the design with the embedded logic analyzer(s). Because ELAs consume hardware resources, a user may choose on occasions to compile the design without the ELAs of the design. To accomplish this, she would indicate through a user interface selection that the ELAs are not to be implemented. To this end, the computer system may include a setting for insertion of embedded logic analyzers.

Note that without taking certain measures, it is possible that a synthesizer or other EDA tool will remove a particular node where the user wishes to capture signals via an embedded logic analyzer. It is not uncommon for a synthesizer to "synthesize out" portions of a design deemed unnecessary during optimization. To ensure that this does not happen to nodes the user has designated for signal-capture, certain measures may have to be taken. In one embodiment, the invention instantiates a logic cell at each such node. If logic cells are instantiated at these nodes, they cannot be synthesized out. Also, if the ELA tool is able to read the logic cell instance names, it can format the names and list them in the ELA file in a format that allows the synthesis tool to recognize the nodes as points in the design to be analyzed by the ELA.

Finally, at a block 209, the computer system synthesizes and compiles the design in accordance with the instructions (scripts) generated at 207. Examples of suitable compilers for this purpose include those provided with Altera's Quartus® and Quartus® II design tools. Other compilers can perform this function, if integrated with system level design interface (e.g., the System Generator for Simulink from Xilinx, Inc.) and modified in a manner allowing entry of embedded logic analyzers. With the compiled design in hand, the computer system then programs that design onto the target hardware device. At this point, the user may run the target hardware device so that the embedded logic analyzers capture the desired signals to allow on chip design verification.

Figure 2B:
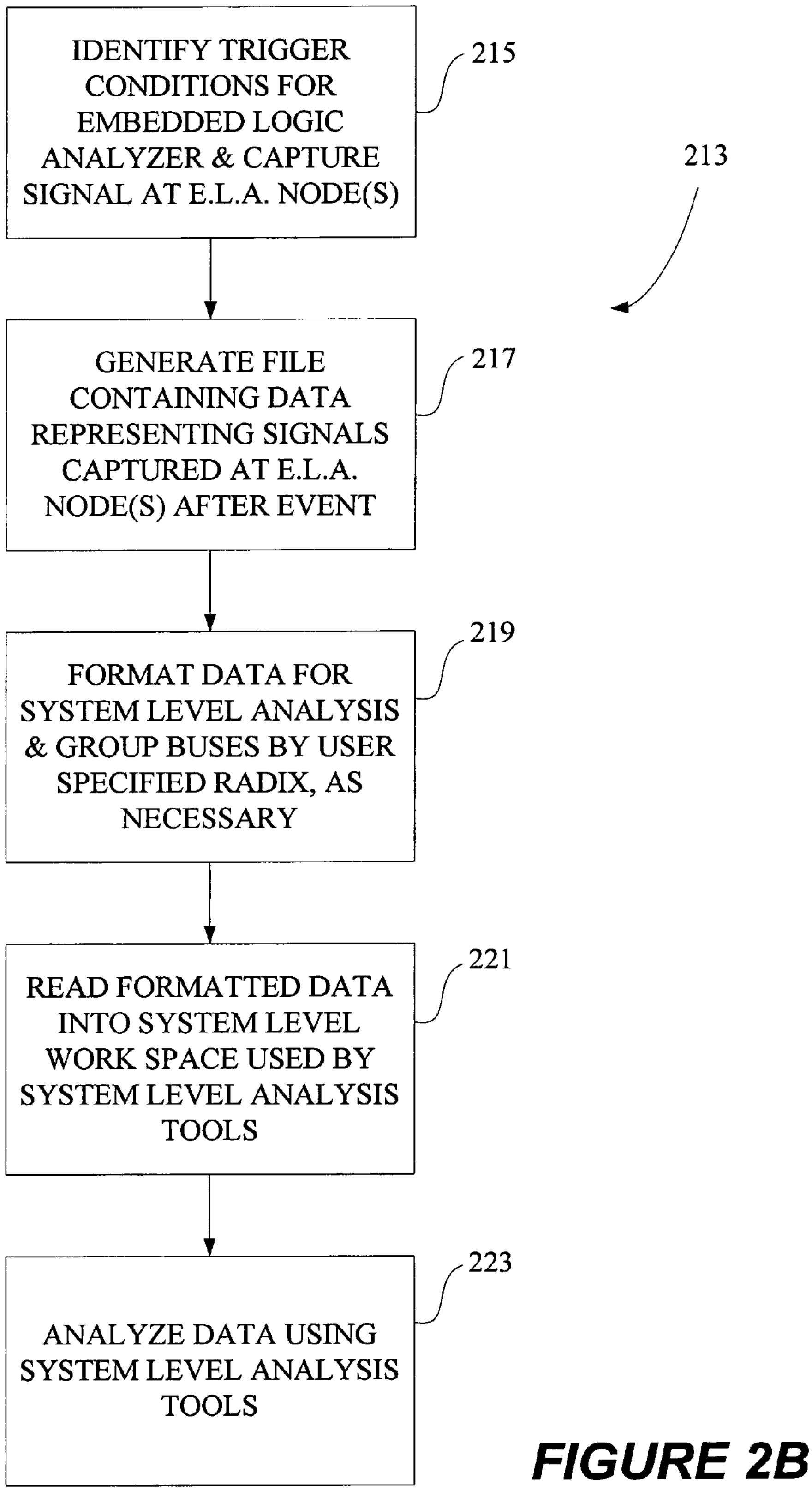
FIG. 2B is a process flow diagram depicting a series of operations that may be employed by a system of this invention in capturing and analyzing signals from an embedded logic analyzer.

FIG. 2B presents a process flow in accordance with another aspect of this invention: using embedded logic analyzers to capture test signals and provide them to system level analysis tools for evaluation by a user. As shown, a process 213 begins at a block 215 with a hardware device (e.g., a development board programmed in accordance with process 201) identifying trigger conditions for an embedded logic analyzer. These trigger conditions may be stored on chip (in memory or a register) or hard coded into the embedded logic analyzer. Alternatively, the conditions may be provided from an external source during operation. Regardless of how these trigger conditions are identified, the embedded logic analyzer captures signal when they are encountered.

As explained in more detail below, trigger conditions specify particular events that must occur at particular nodes before an embedded logic analyzer begins to capture signals. Once these trigger conditions are met, the embedded logic analyzer captures samples until it reaches the full buffer depth. Typically, though not necessarily, when two or more trigger conditions are specified, each of these must be met prior to signal capture. In other words, each trigger condition is logically related by an AND function. Examples of trigger conditions include an input value of high, an input value of low, a rising edge in an input signal and a falling edge in an input signal.

After the appropriate signal has been captured by the embedded logic analyzer at 215, the computer system next generates a file containing data representing the signals captured at the embedded logic analyzer. See block 217. This may simply be a file containing data in the format provided by the embedded logic analyzer hardware itself. Frequently, it will be necessary to reformat the data for the system level analysis tool used to analyze the data. See block 219.

Examples of typical formats employed by embedded logic analyzers include vector waveform (vwf), vector table (tbl), vector files (vec), comma separated value (csv), and Verilog value change dump (vcd). In the event that a system level workspace will not read such format, the data must be reformatted as indicated at block 219. In one example of typical file format employed by a system level workspace, an individual workspace variable is presented as an individual column of data. For example, a workspace variable representing the signals captured at a counter output, would be given its own column.

Additionally, at block 219, the computer system may group the captured signals from one or more embedded logic analyzers as specified by the user. It may also apply any user specified radix. Examples of selectable radixes include binary, octal, hexadecimal, unsigned, signed, and two's-complement.

Next, the formatted data is read into a system level workspace used by the appropriate system level analysis tools. See block 221. As indicated, a system level workspace provides variables in memory for use by system level analysis tools. Finally, at block 223, the computer system analyzes the formatted data from the workspace using at least one system level analysis tool provided by the system level environment. Examples of such tools include tools for performing Fourier analyses, power spectral density estimations, cross spectral density estimations, discrete cosine transforms, chirp-z transforms, Hilbert transforms, resampling, time-frequency analysis, correlation coefficient computation, covariance computation, and the like. In sum, this invention allows users to conveniently and automatically provide data captured by an embedded logic analyzer to high-level system level analysis tools. Heretofore, the rich analytical functionality provided by system level environments could not be conveniently used to analyze signals from embedded logic analyzers.

FIG. 2C presents an example of an embedded logic analyzer file 225 as may be used by a compiler to facilitate implementing embedded logic analyzers in a hardware design. File 225 may be used as described at block 205 of process flow 201 in FIG. 2A. As illustrated, FIG. 2C includes a list of the various nodes in the hardware design where embedded logic analyzers are inserted. The compiler uses this information to determine certain parameters such as buffer depth and trigger conditions associated with ELA design at the particular nodes. In addition, file 225 may specify other information related to the target hardware device including the type of hardware device and the type of cable employed to transfer signal data from embedded logic analyzers to off chip locations. For example, the user may specify an Altera ByteBlasterMV™ cable or an Altera MasterBlaster™ cable.

System Level Interface (Example)

This example illustrates how a system level interface can be used to create and use a design that includes embedded logic analyzers. It is depicted in FIGS. 3A-3I and represents but one specific example of such interface. Many different interfaces providing vastly different looks and feels can be used with this invention. In this example, the interface allows analysis of six internal nodes in a simple switch controller design named "switch_control." In switch_control, an LED on a DSP development board (the target hardware device) turns on or off in response to a user pressing on user controlled switches and the value of an incrementer.

As shown in FIGS. 3B and 3C, the design itself includes an incrementer function 327 feeding a comparator 331, and four switches 319, 321, 323, and 325 feeding into two AND gates 333 and 335. The comparator and AND gate outputs feed an OR gate 337, which in turn feeds an LED 317 on the DSP development board. On the target hardware device (the DSP board), an embedded logic analyzer captures the signal activity at the output of each AND gate and the incrementer. The logic analyzer retrieves the values and displays them in a MATLAB workspace.

A user can enter a hardware design by selecting available blocks from a directory and positioning them at desired locations in the system level interface. As depicted in FIG. 3A, such directory includes an embedded logic analyzer block, as well as other hardware blocks.

FIG. 3B shows a window 315 from the system level design interface. The window displays the original design, without an embedded logic analyzer block. In a typical usage, the designer selects the individual blocks using a directory browser (e.g., FIG. 3A) and drags them to an appropriate location, where she drops them into position. Thus, in this example, the LED output 317, switch inputs 319, 321, 323, and 325, counter 327, ground 329, comparator 331, and logic gates 333, 335, and 337 can all be found in directory libraries and positioned onto window 315 via the system level interface. The lines connecting these blocks are also entered via the interface. The general procedure for entering and modifying such designs is well known in the EDA art, particularly to users of Simulink and related system level environments.

The user can add embedded logic analyzer blocks to the system level block diagram by positioning the ELA blocks at the signals (also called nodes) she wants to analyze, in this example the output of each AND gate 333 and 335 and the output of the incrementer 327. The user can add an embedded logic analyzer block in the same manner as other blocks; e.g., using a system level browser, for example. Then the user may drag and drop an embedded logic analyzer block 339 into her design. In this example, the user positions a first instance of the block so that it is on top of a connection line between the logical AND block 333 and the logical OR block 337. Similarly, she may position two other logic analyzer blocks 341 and 343 onto the design at the positions shown in FIG. 3C. By positioning the block using this method (or other comparable method), the system level design software inserts the block and joins connection lines to both sides of it.

The user may name each embedded logic analyzer block separately. In this example, she has named block 339 "firstandout," block 341, "secondandout," and block 343 "cntout." In one embodiment, this accomplished by clicking the default text appearing under the blocks as they are entered. Clicking selects the text and allows the user to edit it.

Preferably, the system level interface allows the user to parameterize the embedded logic analyzer blocks that she enters in her design. One parameterization specifies which bits of a signal are to be captured. For example, the signal at analyzer block 343 is an 8 bit signal. The user may only be interested in capturing the 3 most significant bits of this signal. To this end, a mask block 345 (depicted in FIG. 3D) permits the user to specify the most significant bit (MSB) and the least significant bit (LSB) bounding the signal to be captured by the embedded logic analyzer (or analyzed by the system level analysis tools). In the example of FIG. 3D, the user has selected bit 7 as the MSB and bit 5 as the LSB. Hence, on the 3 most significant bits will be captured for analysis. In this embodiment, the parameter selection is accomplished using a standard user interface. First, the user types the bit positions in the MSB and LSB fields of the mask block 345. Then, she clicks the OK button and saves the settings by choosing Save from the file menu in window 315.

The mask block 345 allows the user to group contiguous bits from any particular signal captured by the embedded logic analyzer. As explained below, the user has the option of analyzing/displaying these grouped bits together or separately. For example, the user can choose to display the bits separately as three 1 bit signals or together as one 3 bit signal (8 discrete values). In certain embodiments of this invention, the user has the option of grouping arbitrary collections of bits in this manner. For example, she may take two contiguous bits from one signal and two contiguous bits from a different signal and concatenate them to produce a 16 bit signal for analysis with system level analysis tools.

Obviously, when the user adds embedded logic analyzer blocks to signals, the signal is connected to the input of the embedded logic analyzer, which alters the overall design. Therefore, the design tools must compile the entire design, including the embedded logic analyzer. To compile the design, the user must provide instructions to do so. In a specific example, this is accomplished from the system level interface by employing a signal compiler icon 347 displayed in window 315. See FIGS. 3B and 3C.

By selecting the signal compiler (e.g., by double clicking icon 347), the design software displays a signal compiler window 349 as shown in FIG. 3E. Window 349 contains buttons for controlling various compilation related functions. It also allows the user to further parameterize the embedded logic analyzer of the hardware design. It does this by allowing the user to select a buffer depth to be used in the embedded logic analyzer. See "tab" 349 devoted to the purpose (labeled "SignalTap" in the figure). Within this tab, the user can select an "Insert Logic Analyzer" option 351. This informs the design software that it must insert an instance of an embedded logic analyzer into the design, and therefore generate appropriate files and scripts for the compiler. As shown, the user also selects a numerical buffer depth in a field 353. This specifies the depth of a sample buffer (i.e., the number of samples stored on chip for each input signal). After entering the buffer depth, the user clicks the OK button on window 349 to complete selection of this buffer depth.

In addition to parameterizing the embedded logic analyzer in this manner, the signal compiler window 349 allows the user to specify various settings associated with compilation. These included the target hardware device (an Altera DSP Board (EP20K200E) development board in this case) selected from a device list 355. The user can also select a synthesis tool and optimization setting (e.g., minimal area versus maximum speed) using lists provided in window 349.

Still further, window 349 allows the user to initiate various compilation related procedures. These include converting the system level representation to a hardware design language representation. In window 349, this is controlled by a "Convert MDL to VHDL" button 357. "MDL" refers to a file type associated with a system level representation of a design. System level designs entered as block diagrams can be represented in code appropriate code such as C++. Clicking button 357 causes the design software to generate an HDL description of the system level design—including an HDL representation of the embedded logic analyzer nodes included in the design. As explained in more detail below, the embedded logic analyzer is represented by its nodes in the HDL code. The instances specify the logic analyzer location, name, port, etc. The trigger conditions, buffer depth, and certain other parameters characterizing the ELA are specified in a file such as that depicted in FIG. 2C.

In the depicted example, when a user selects button 357, not only does the design software create the HDL representation of the system level design, it also displays a message indicating an estimated number of ESBs (embedded system blocks) required to implement the embedded logic analyzer on a programmable hardware device. The estimated usage is a function of the number of nodes to be analyzed and the sample depth.

Other compilation-related operations that can be controlled by the user through the signal compiler window include synthesis (button 359), compilation (button 361) and programming the target hardware device (button 363). In an alternative embodiment, these operations are not left to the discretion of the user. Each operation (or some combination of these operations) is performed automatically, one after the other. For example, the user may initiate conversion to HDL, synthesis, and compilation by a single user input in the interface. In another alternative, the user can either control or not control, the separate execution of each of these operations.

In the depicted embodiment, an embedded logic analyzer icon 359 appears in window 315 as depicted in FIG. 3C. In one embodiment, this block first appears when the user drags it into the system level design interface window. The displayed analyzer icon 359 allows the user to conduct various operations and set various parameters. For example, the user can enter one or more trigger conditions, specify the radix for signals captured the embedded logic analyzer, and control initiation of the embedded logic analyzer operation. User interface controls for these operations are depicted in an embedded logic analyzer window 361 appearing in FIGS. 3F and 3G. In one embodiment, the interface displays window 361 when the user double clicks on icon 359.

Figure 3F:
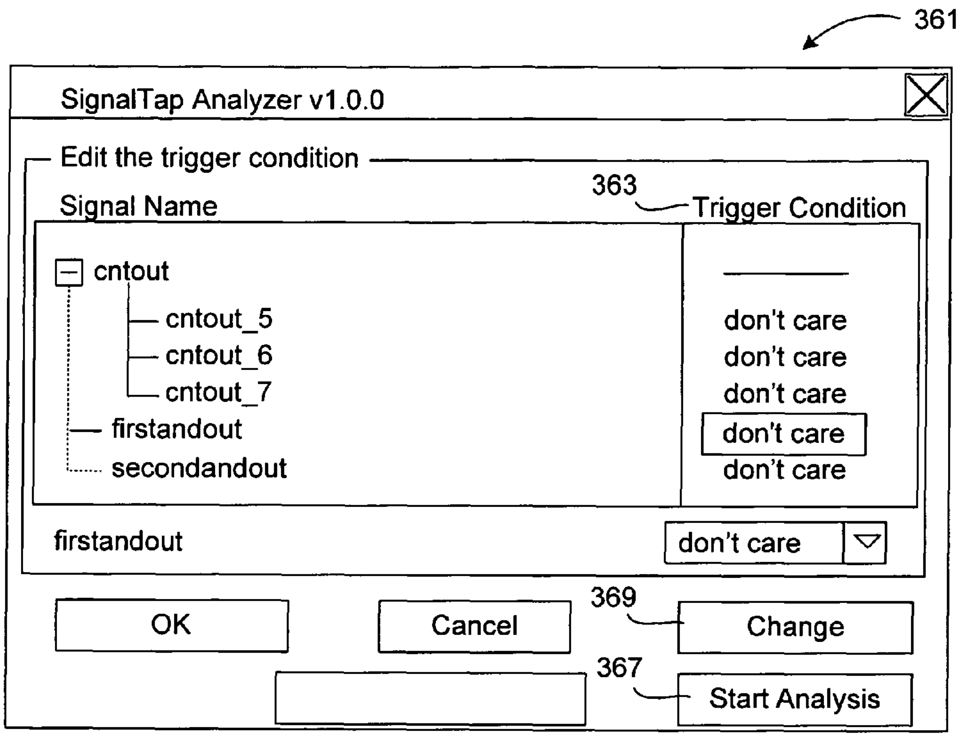
FIG. 3F is an “embedded logic analyzer block” presented by the system level design interface that allows the user to set trigger conditions for the analyzer, initiate E.L.A. analysis, and set certain other parameters.

Regarding trigger conditions, some embodiments of the invention direct the logic analyzer to begin capturing signals as soon as the hardware device begins operation. However, it is more common that one or more trigger conditions be specified. Various interface tools may allow the user to enter trigger conditions via the system level design interface. As mentioned, the interface in the depicted embodiment provides embedded logic analyzer icon 359 for this purpose. FIG. 3F lists five signal names: firstandout, secondandout, and bits 5, 6, and 7 for cntout. Each of these can have its own associated trigger condition. The trigger conditions are listed in a "trigger condition" column 363. The collection of trigger conditions in column 363 represents a trigger pattern describing a logic event. In this example, the embedded logic analyzer is triggered when it detects the trigger pattern on the input signals. Any number of possible trigger events can be set. In a specific example, the trigger conditions are specified in terms of logic levels and/or edges. In one embodiment, these conditions are provided in a comparison register used by the embedded logic analyzer to recognize the moment when the input signals match the data specified in the trigger pattern.

The trigger pattern is composed of a logic condition for each input signal. By default, all signal conditions for the trigger pattern are set to "Don't Care," masking them from trigger recognition. That is, the embedded logic analyzer does not consider the state of a "Don't Care" signal when determining whether to begin capturing signals. In a specific embodiment, the user can select one of the following logic conditions for each input signal in the trigger pattern: Don't Care, Low, High, Rising Edge, Falling Edge, and Either Edge. In one embodiment, the user selects the trigger condition by clicking on the associated signal in the "Signal Name" column of window 361. The user is then given a list of the available trigger conditions, one of which she selects and then follows by clicking a "change" button 369.

Figure 3G:
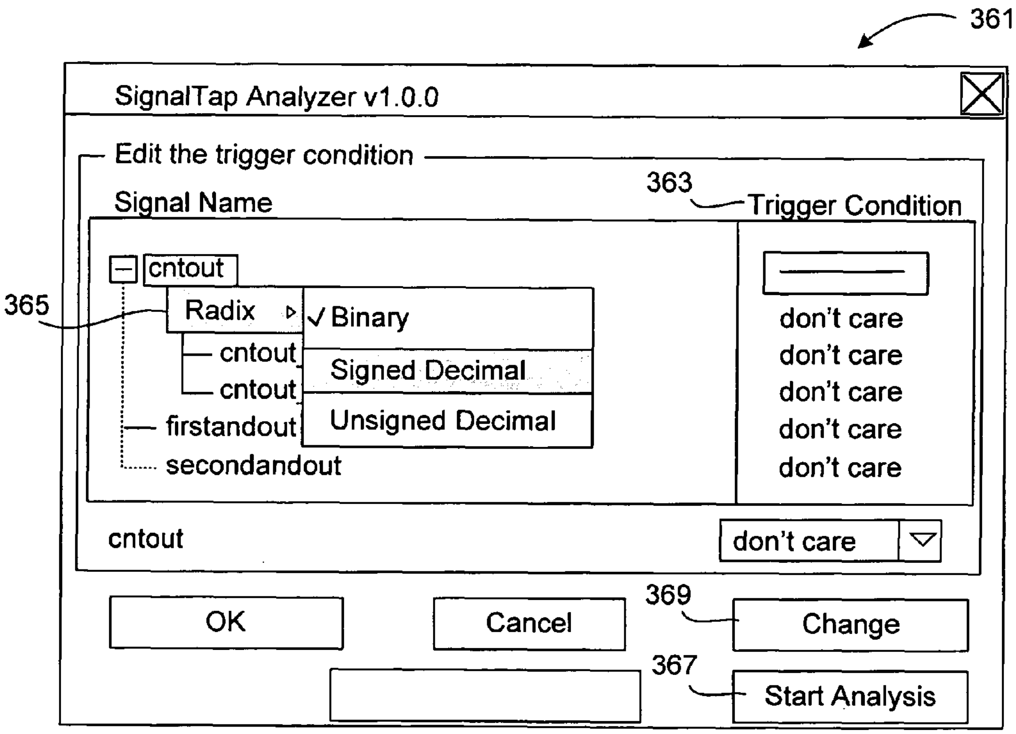
FIG. 3G is a view of the E.L.A. block of FIG. 3F, but showing how a user can set the radix for the signals captured by the embedded logic analyzer.

As indicated above, the user can also specify the radix for a signal or group of signals. FIG. 3G depicts one approach to accomplishing this. In this example, the user selects a signal by right clicking on the signal name in the Signal Name column. This produces a popup menu 365 identified as "Radix." As shown, this menu gives the options binary, signed decimal, and unsigned decimal for the selected signal. If the user selects signed decimal, for example, the radix for that signal is updated. As indicated above, the radix settings an interface might make available include the following: binary, octal, hexadecimal, unsigned, signed, and two's-complement.

Window 361 also allows the user to initiate embedded logic analyzer operation. The user will accomplish by selecting a Start Analysis button 367 on the bottom right of window 361. In response, the embedded logic analyzer begins analyzing the data and waits for the trigger conditions to occur. When the trigger conditions are met, the logic analyzer begins capturing signals. It may capture only those signals incident at the analyzer nodes after the conditions are met, or it may capture some range of signals that already past at the analyzer nodes when the conditions are met. In one example, the analyzer captures data around a trigger point: 12% of the data is pre-trigger and 88% of the data is post-trigger.

Figure 3H:
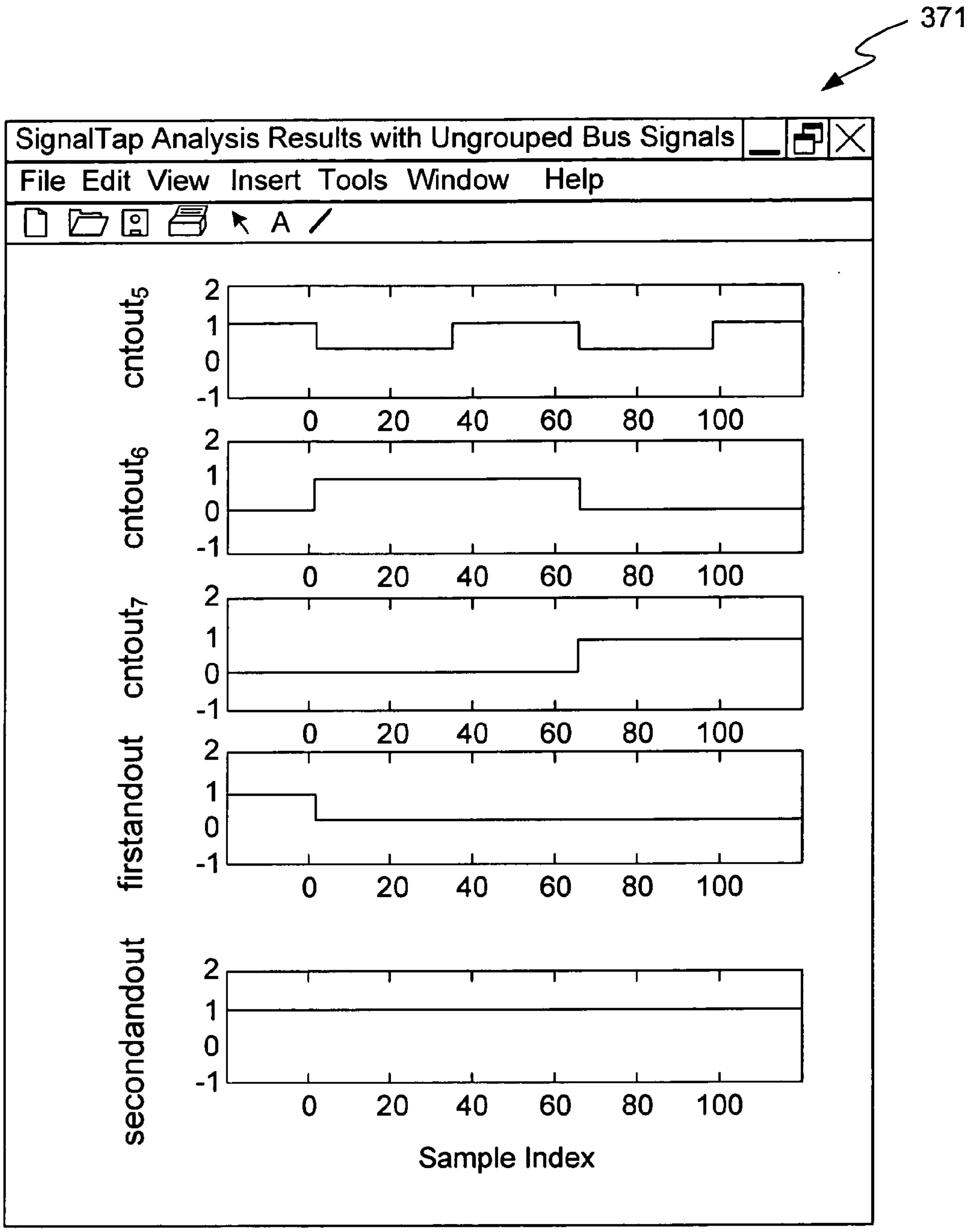
FIG. 3H is a screen shot of a window that displays captured signals in an ungrouped format.
Figure 3I:
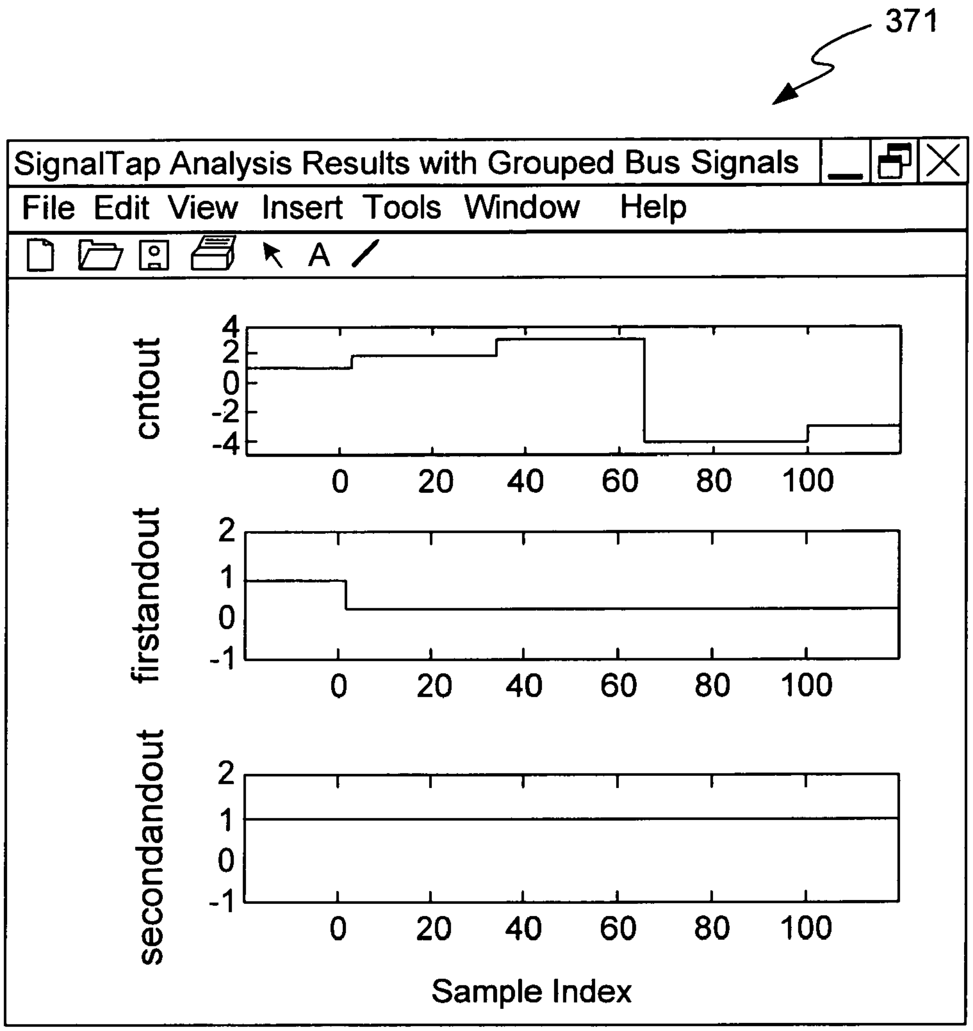
FIG. 3I is a screen shot of the window of FIG. 3H displaying captured signals in a grouped format.

The captured data may be stored in a text file or other file suitable for display as a waveform in the system level interface (e.g., in a MATLAB plot). The data may also be transferred to a workspace, as a global variable, for analysis by system level analysis tools. FIGS. 3H and 3I depict a system level interface window 371 displaying captured signals. Window 371, as shown in FIG. 3H, displays ungrouped bus signals. In other words, each separate bit is displayed as a separate binary signal, even when multiple bits occur together in a signal as they do in "cntout." As indicated above, a user may specify that certain signals are to be grouped for display and analysis. For example, bits 5-7 were grouped for the cntout signal. Window 371, as displayed in FIG. 3I, shows the 3 bit cntout signal spanning a range of 8 integer values. They are displayed in the radix specified by the user.

Note that the individual logic analyzer blocks presented in the depiction of the hardware design (e.g., blocks 339, 341, and 343 of FIG. 3C) do not necessarily correspond with individual logic analyzers. Rather they correspond to nodes where one or more embedded logic analyzers capture signals. An embedded logic analyzer is not, per se, shown in the design of FIG. 3C. This is because the EDA system implements the analyzer itself using its own internal logic together with information specified via an ELA file such as that depicted in FIG. 2C and any other information input by the user via the interface depicted in FIGS. 3D-3G. Of course, in other embodiments of this invention, it may be appropriate to explicitly depict the ELA in the system level design. In such cases, the HDL representation of the design could include more details of the desired ELA implementation—and the compiler would not require the logic required to implement an ELA without the benefit of an HDL description. Note also that designs may specify more than one ELA. For example, if some nodes are to provide a first buffer depth and other nodes are to provide a second buffer depth, it may be desirable to implement two separate ELAs: one for the first set of nodes and another for the second set of nodes.

HDL Code (Example)

Some typical features of the conversion of a system level representation to an HDL representation will now be described. When a user enters a design in a system level interface, the modules of that interface are provided with both a graphical representation and a model representation. The model representation is employed during system level simulation of the design. The model representation provides a functional or behavioral description of the particular module with which it is associated. Typically, the model representation is provided in a compilable or interpretive language such as C++ or MATLAB's M Script. In the context of a Simulink system level simulator, the various modules and their model representation are packaged in an "mdl" file containing the necessary information to perform a simulation of the user-entered design when the model representations are executed.

In the context of this invention, embedded logic analyzer nodes preferably include a very simple model representation. This is because the nodes are not expected to operate on or otherwise modify a signal. In a typical case, the model representation of an embedded logic analyzer node is simply an "input=output" representation.

When a system level design containing one or more embedded logic analyzers is to be implemented in hardware, the system level hardware development tool platform (see FIG. 1C) generates an HDL representation of the design. It accomplishes this by instantiating HDL entities representing different types of hardware modules. These entities are provided as standard blocks of code (some of which will be described with reference to FIGS. 4A through 4D below), which require port maps and sometimes parameterization, to become instantiated. Default or user-defined parameters and user defined connections provided in the system level interface provide the necessary information to parameterize the HDL entities associated with a user-entered design.

In one embodiment, an embedded logic analyzer is not itself represented in the HDL code. Its signal capture nodes are represented so that they cannot be synthesized out or otherwise removed. The compiler, in this embodiment, implements the embedded logic analyzer itself, without regard to the HDL code—except for the node locations where the analyzer will capture signals. Altera's Quartus II compiler, for example, has the needed logic to implement the embedded logic analyzer in this manner.

Turning now to FIGS. 4A through 4D, HDL code for implementing the design shown in window 315 of system level interface will now be described. Code 403 identifies certain libraries that are employed to implement the hardware design. These libraries contain programmed modules of various types that can implement certain functions of hardware modules selected by the user, such as counters, logic gates, etc.

Code 405 declares variable types for the inputs and outputs provided in the user design. The remainder of the code describes the details of the modules and nodes contained within the design. Code 407, for example, declares a variable type for each of the various signals that feed the various blocks in the design. Next, a series of statements in code 409 assign the various inputs and outputs of the user's design to specific ones of the signals declared at 407.

Next, the code describes the five simple logic modules entered in the design depicted in FIGS. 3B and 3C. Specifically, code 411 represents incrementer 327, code 413 represents comparator 331, code 415 represents AND gate 335, code 417 represents AND gate 333, and code 419 represents OR gate 337. Each of these blocks of code includes a "generic map" and a "port map". The generic map specifies various parameters associated with the operation of the particular hardware module under consideration. The values of those parameters may be set by default or received from user input via the system level interface. The port map specifies which signals go to which ports of the hardware module. These are dictated, in some measure, by the connections entered by the user via the system level interface.

Of particular relevance to the present invention, code blocks 421, 423, and 425 represent embedded logic analyzer blocks 343, 339, and 341, respectively. As with other hardware modules, each of them has a generic map component and a port map component. The port maps identify the input and output signals for each analyzer node. The generic map components simply identify the range of bits to be captured at the logic analyzer nodes. As depicted, logic analyzer nodes 339 and 341 capture one bit signals, while logic analyzer node 343, captures an 8-bit signal, with one additional bit for a sign.

During compilation, the embedded logic analyzer node blocks, like every other block coded in the HDL representation, is converted to a standard hardware representation used by the compiler. This includes particular logic elements and memory blocks, which vary depending upon the buffer depth specified by the user. In certain embodiments, other parameters may likewise affect the structure of the hardware element generated by the compiler to implement the embedded logic analyzer. As indicated above, various parameters can be employed to characterize a logic analyzer. These include, the radix of signals captured by the analyzer, the range of bits within a signal to be analyzed, the trigger conditions triggering capture of signals, the grouping of captured bits of presentation and analysis, as well as the buffer depth of the analyzer. Of these, only the buffer depth and node locations need directly affect the hardware. As illustrated in FIGS. 4A through 4D, the HDL code in this example specifies only the node locations. Thus, the other information must be presented to the compiler and/or hardware via a different route. It could, in another embodiment, be provided via the HDL description. In this particular example however, it is provided by an embedded logic analyzer file, such as that described with reference to FIG. 2C. In such file, both the buffer depth and trigger conditions are specified. During compilation, the buffer depth is used to develop the programmer files that specify how the logic elements and memory elements are implemented on the target hardware device. In a specific embodiment, the trigger conditions are not hard coded into the resulting hardware device. Rather, they are provided from an external source to the target hardware device prior to or during operation. In one specific embodiment, the trigger conditions are loaded into a register provided on the hardware device.

Other user specified parameter such as the radix, and bit mask for a given signal are used during the analysis portion of the inventive methodology. In other words, after the signal or signals are captured by the embedded logic analyzer and then presented to the system level analysis tools, the other parameters, such as the radix, are applied to those captured signals. Hence, those parameters need not be part of the HDL code or other information used by the compiler.

Other Embodiments

While the methods, apparatus, and computer program products of this invention are applicable to any electronic design, they find particular value in the context of programmable logic devices (PLDs). A PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large scale integration integrated circuits can instead be performed by programmable logic devices. Programmable logic devices supplied by integrated circuit manufacturers like Altera Corporation (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD comprises an array of logic cells that can be individually programmed and arbitrarily interconnected to each other to provide internal input and output signals, thus permitting the performance of complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

In addition to methods, apparatus, and computer program products, this invention also relates to programmable logic devices (and other target hardware devices) programmed with a design prepared in accordance with the above-described methods.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for designing, simulating, compiling and/or programming a device. Therefore, the described embodiments should be taken as illustrative and not restrictive, and the invention should not be limited to the details given herein but should be defined by the following claims and their full scope of equivalents.

What is claimed is:

1. A method comprising:

receiving instructions for entering a hardware design including one or more embedded logic analyzers in a system level interface, the instructions specifying one or more embedded logic analyzer nodes in the hardware design where the one or more embedded logic analyzers are provided to capture signals, wherein the system level interface is integrated with an electronic design automation (EDA) system configured to design programmable chips and compile designs for the programmable chips;

receiving at the system level interface parameter information for parameterizing the one or more embedded logic analyzers, wherein the parameter information is used to select particular capture bits with a mask block specifying the most significant bit and the least significant bit bounding the selected particular capture bits;

receiving a command entered in the system level interface for converting the hardware design, with the one or more embedded logic analyzers, to a Hardware Design Language (HDL) representation of the hardware design, including the one or more embedded logic analyzers;

converting the hardware design specifying the one or more embedded logic analyzers to the HDL representation, wherein the HDL representation is compiled by the EDA system to create a compiled hardware design, the compiled hardware design including compiled instructions for implementing the one or more embedded logic analyzers.

2. The method of claim 1, further comprising programming a target hardware device with the compiled hardware design to thereby implement the hardware design with one or more embedded logic analyzers on the target hardware device.

3. The method of claim 2, wherein said programming is performed in response to instructions received through the system level interface.

4. The method of claim 2, further comprising:

(i) capturing signals with said one or more embedded logic analyzers in the target hardware device; and (ii) analyzing said signals using a system level analysis tool accessible via the system level interface.

5. The method of claim 1, wherein compiling the HDL representation is performed in response to user instructions received through the system level interface.

6. The method of claim 1, further comprising:

(i) receiving one or more specified trigger events for capturing signals at the one or more nodes with the one or more logic analyzers, wherein said events are specified by a user via the system level interface; and (ii) providing the one or more specified trigger events to a target hardware device programmed with the compiled hardware design.

7. The method of claim 1, further comprising displaying the hardware design in the system level interface as a block diagram of nodes including the locations of the one or more embedded logic analyzers.

8. The method of claim 1, further comprising, in the system level interface, receiving a user command to group one or more bits of signals at the one or more nodes where the one or more embedded logic analyzers capture signals, thereby causing the one or more bits to be captured at the one or more embedded logic analyzers.

9. The method of claim 1, further comprising, in the system level interface, receiving a user command specifying a radix for signals captured by at least one of the embedded logic analyzers.

10. The method of claim 1, wherein said hardware design or said HDL representation specifies a single embedded logic analyzer for capturing signals at multiple separate nodes in the hardware design.

11. A non-transitory computer readable medium having computer code embedded therein, the non-transitory computer readable medium comprising:

computer code for receiving instructions for entering a hardware design including one or more embedded logic analyzers in a system level interface, the instructions specifying one or more embedded logic analyzer nodes in the hardware design where the one or more embedded logic analyzers are provided to capture signals, wherein the system level interface is integrated with an electronic design automation (EDA) system configured to design programmable chips and compile designs for the programmable chips;

computer code for receiving at the system level interface parameter information for parameterizing the one or more embedded logic analyzers, wherein the parameter information is used to select particular capture bits with a mask block specifying the most significant bit and the least significant bit bounding the selected particular capture bits;

computer code for receiving a command entered in the system level interface for converting the hardware design, with the one or more embedded logic analyzers, to a Hardware Design Language (HDL) representation of the hardware design, including the one or more embedded logic analyzers;

computer code for converting the hardware design specifying the one or more embedded logic analyzers to the HDL representation, wherein the HDL representation is compiled by the EDA system to create a compiled hardware design, the compiled hardware design including compiled instructions for implementing the one or more embedded logic analyzers.

12. The non-transitory computer readable medium of claim 11, further comprising computer code for programming a target hardware device with the compiled hardware design to thereby implement the hardware design with one or more embedded logic analyzers on the target hardware device.

13. An apparatus comprising:

a system level interface configured to receive instructions for implementing a hardware design having an embedded logic analyzer, the instructions specifying an embedded logic analyzer node in the hardware design, wherein the embedded logic analyzer is provided to capture signals, wherein the system level interface is integrated with an electronic design automation (EDA) system configured to design programmable chips and compile designs for the programmable chips;

a processor configured to identify system level interface parameter information for parameterizing the embedded logic analyzer, wherein the parameter information is used to select particular capture bits with a mask block specifying the most significant bit and the least significant bit bounding the selected particular capture bits;

compiler logic configured to convert the hardware design specifying the embedded logic analyzer to a Hardware Design Language (HDL) representation, wherein the HDL representation is compiled by the EDA system to create a compiled hardware design, the compiled hardware design including compiled instructions for implementing the embedded logic analyzer.

14. The apparatus of claim 13, wherein the processor is configured to identify a trigger event for capturing signals at the logic analyzer node.

15. The apparatus of claim 13, wherein the trigger event is identified by the user through the system level interface.

16. The apparatus of claim 13, wherein the system level interface is further configured to receive a user command specifying a radix for signals captured by the embedded logic analyzer.

17. The apparatus of claim 13, wherein the embedded logic analyzer is configured to capture signals at multiple, separate embedded logic analyzer nodes.

* * * * *